United States Patent
Fujisawa et al.

(10) Patent No.: US 7,518,929 B2
(45) Date of Patent: *Apr. 14, 2009

(54) NONVOLATILE SEMICONDUCTOR MEMORY DEVICE FOR WRITING MULTIVALUED DATA

(75) Inventors: Tomoyuki Fujisawa, Hyogo (JP); Hikaru Shibahara, Hyogo (JP); Hidenori Mitani, Hyogo (JP); Akihiko Kanda, Hyogo (JP)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/819,015

(22) Filed: Jun. 25, 2007

(65) Prior Publication Data

US 2008/0019176 A1    Jan. 24, 2008

Related U.S. Application Data

(63) Continuation of application No. 11/082,992, filed on Mar. 18, 2005, now Pat. No. 7,242,611.

(30) Foreign Application Priority Data

Mar. 30, 2004    (JP)    ............................. 2004-099590

(51) Int. Cl.
  *G11C 11/34*    (2006.01)
  *G11C 16/06*    (2006.01)

(52) U.S. Cl. ........................... 365/185.22; 365/185.03; 365/185.21

(58) Field of Classification Search ............ 365/185.22, 365/185.03, 207, 189.07, 185.21
See application file for complete search history.

(56) References Cited

U.S. PATENT DOCUMENTS 5,602,789 A * 2/1997 Endoh et al. ............ 365/185.03
6,185,128 B1   2/2001 Chen et al.
6,744,670 B2   6/2004 Tamada et al.

FOREIGN PATENT DOCUMENTS

JP    2001-312890    11/2001

* cited by examiner

*Primary Examiner*—Hoai V Ho
*Assistant Examiner*—Kretelia Graham
(74) *Attorney, Agent, or Firm*—Myers Bigel Sibley & Sajovec

(57) ABSTRACT

A memory cell of a memory array stores two bits. A memory array sense amplifier provides two bits in a verify operation. Two bits in a page buffer stores a write target value for the corresponding memory cell. Each bit in a mask buffer stores a value defining processing to be effected on the corresponding memory cell. A write driver applies a write pulse when the bit in the mask buffer corresponding to the selected memory cell is "0". A verify circuit compares the two bits provided from the memory array sense amplifier with the corresponding two bits in the page buffer, and changes the corresponding bit in the mask buffer from "0" to "1" when the result of the comparison represents matching.

3 Claims, 18 Drawing Sheets

FIG.6

| LOGICAL VALUE IN MEMORY CELL | PREVIOUS WRITE TARGET VALUE | NEW WRITE TARGET VALUE |
|---|---|---|
| 0-0 | 0-0<br>0-1<br>1-0<br>1-1 | 0-0<br>0-0<br>0-0<br>0-0 |
| 0-1 | 0-0<br>0-1<br>1-0<br>1-1 | 0-0<br>0-1<br>0-0<br>0-1 |
| 1-0 | 0-0<br>0-1<br>1-0<br>1-1 | 0-0<br>0-0<br>1-0<br>1-0 |
| 1-1 | 0-0<br>0-1<br>1-0<br>1-1 | 0-0<br>0-1<br>1-0<br>1-1 |

PAGE BUFFER
(PAGE BUFFER DATA IN
PROGRAM IS UNCHANGED)

MASK BUFFER

NONVOLATILE SEMICONDUCTOR MEMORY DEVICE FOR WRITING MULTIVALUED DATA

CROSS REFERENCE TO RELATED APPLICATIONS

This application is a Continuation of U.S. application Ser. No. 11/082,992, filed Mar. 18, 2005 now U.S. Pat. No. 7,242,611, claiming priority of Japanese Application No. 2004-099590(P), filed Mar. 30, 2004, the entire contents of each of which are hereby incorporated by reference.

BACKGROUND OF THE INVENTION

1. Field of the Invention

The present invention relates to a nonvolatile semiconductor memory device, and particularly to a technique for writing multivalued data in a nonvolatile semiconductor memory device.

2. Description of the Background Art

In recent years, nonvolatile semiconductor memory devices such as a flash memory capable of nonvolatile data storage have become mainstream. A verify operation is performed in the nonvolatile semiconductor memory device such as a flash memory for determining whether writing was correctly performed or not.

For example, Japanese Patent Laying-Open No. 2001-312890 has disclosed the following verify operation. One page buffer P/B is connected to one bit line. Each page buffer P/B latches program data corresponding to a selected memory cell. The plurality of page buffers P/B are connected to sense amplifiers S/A•0 in a read/write circuit via column gates. In verify read, read data in a selected column is detected by using the sense amplifier provided for normal data reading. The read data detected by the sense amplifier S/A•0, i.e., a result of the verify read is transferred to the page buffer P/B in a selected column. The program data in page buffer P/B is rewritten based on a result of the verify read.

For writing multiple values into one memory cell transistor, two verify operations, i.e., lower foot verify and upper foot verify must be performed of determining whether a threshold of the memory cell is within a desired range or not. However, program data in a page buffer is rewritten with a result of the first verify read so that the second verify cannot performed.

SUMMARY OF THE INVENTION

Accordingly, it is an object of the invention to provide a nonvolatile semiconductor memory device, in which verify can be performed appropriately when multivalued writing is effected on the nonvolatile memory cell transistor.

A nonvolatile semiconductor memory device according to an aspect of the invention includes a memory array including a plurality of nonvolatile memory cell transistors arranged in rows and columns, and each storing a logical value of N bits according to a threshold voltage; a memory array sense amplifier operating for lower foot verify to provide a logical value of N bits by determining N times a range of a threshold voltage of a selected memory cell by binary chop searching based on sections of the threshold voltage for the lower foot verify, and operating for upper foot verify to provide a logical value of N bits by determining N times the range of the threshold voltage of the selected memory cell by the binary chop searching based on the sections of the threshold voltage for the upper foot verify; a first buffer having N bits each storing a write target value for the corresponding memory cell; a second buffer storing in each bit a value determining processing to be effected on the corresponding memory cell; a write driver selecting application of a write pulse when the bit in the second buffer corresponding to the selected memory cell indicates a first value; and a verify circuit comparing a logical value of the N bits provided from the memory array sense amplifier with the write target value of the corresponding N bits in the first buffer, providing a signal indicating success of the verify when a result of the comparison indicates matching, and providing a signal indicating failure of the verify when a result of the comparison indicates mismatching. When the result of comparison indicates the matching, and the bit in the second buffer corresponding to the selected memory cell indicates the first value, the verify circuit changes a second value into the bit.

According to the aspect of the invention, the nonvolatile semiconductor memory device can appropriately perform the verify when multivalued writing is effected on the nonvolatile memory transistors.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 illustrates new write target values produced by dummy verify from values stored in the memory cells and externally applied write target values.

DESCRIPTION OF THE PREFERRED EMBODIMENTS

Embodiments of the invention will now be described with reference to the drawings.

First Embodiment

A first embodiment relates to a nonvolatile semiconductor memory device having a mask buffer and a page buffer.

Before describing a nonvolatile semiconductor memory device according to the embodiment, description will now be given on a flash memory cell.

A flash memory cell is formed of a transistor having a floating gate, a control gate, a source and a drain. The control gate is connected to a word line WL for selecting a memory cell. The source and drain are connected to a source line SL and a bit line BL, respectively.

Writing of data into the flash memory cell is performed by applying a write pulse thereto. Thereby, electrons are injected into the floating gate by using Channel Hot Electrons (CHEs) so that the threshold voltage is raised to perform the data writing.

Reading of data from the flash memory cell is performed in such a manner that the bit line is precharged, a constant voltage is applied to a word line coupled to a control gate to perform memory discharging for a predetermined time, and then a magnitude of a current flowing through the bit line is detected.

(Flash Memory Having Memory Cells of SLCs)

Figure 1:
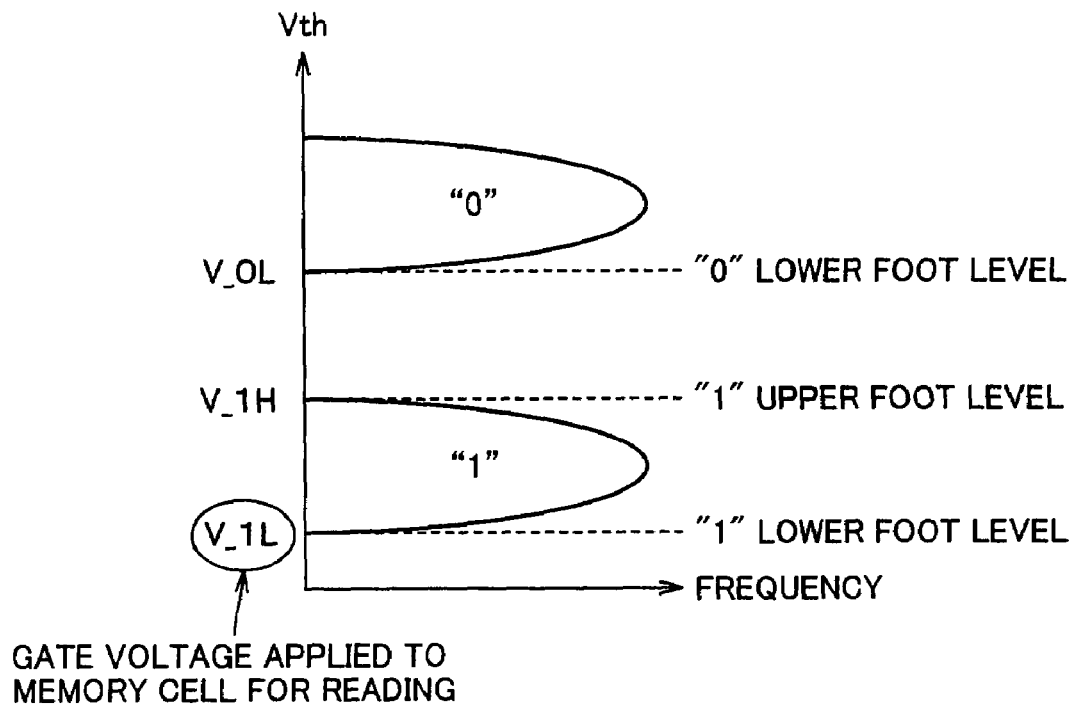
FIG. 1 illustrates a distribution of a threshold voltage Vth of memory cells of SLC.

FIG. 1 illustrates a distribution of a threshold voltage Vth of a flash memory cell of SLC (Single Level Cell). In FIG. 1, an abscissa gives a frequency (i.e., number of memory cells). As illustrated in FIG. 1, variations in the threshold voltage are present in the memory cells. In view of such variations, therefore, a correspondence or relationship is defined between a threshold voltage of each memory cell and a logical value. More specifically, such a relationship is determined that a memory cell having a threshold voltage in a range equal to or higher than "0" lower foot corresponds to a logical value "0", and a memory cell having a threshold voltage in a range equal to or higher than "1" lower foot and equal to or lower than "1" upper foot corresponds to a logical value "1". Therefore, the memory cell store binary data of "0" or "1" according to the threshold voltage.

(Write Sequence of Flash Memory Having Memory Cells of SLCs)

Figure 2:
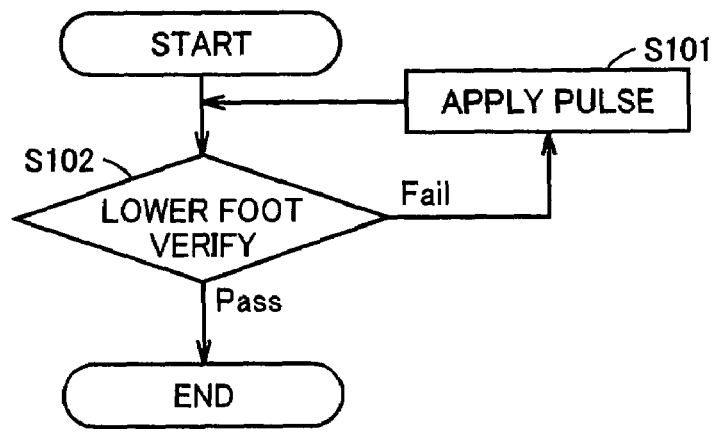
FIG. 2 is a flowchart of a write sequence of a flash memory having a memory cell of an SLC.

FIG. 2 is a flowchart illustrating a write sequence of a flash memory having memory cells of SLCs.

In a step S101, a write pulse of a predetermined voltage and a predetermined pulse width is applied to a gate of the memory cell.

In a step S102, lower foot verify of threshold voltage Vth of the memory cell is performed. Thus, it is determined whether threshold voltage Vth of the memory cell is equal to or higher than the "0" lower foot level (=V_0L) or not. More specifically, when a gate voltage for verify is applied to the memory cell, a value Im of the current flowing therethrough may be equal to or smaller than a value Is of the current flowing with the "0" lower foot level. In this case, it is determined that threshold voltage Vth is at the "0" lower foot level or higher. If current amount Im exceeds current value Is, it is determined that threshold voltage Vth is lower than the "0" lower foot level.

By repeating steps S101 and S102, the number of times of applying the write pulse increases, and threshold voltage Vth of the memory cell increases. Lower foot verify is effected on threshold voltage Vth thus increased.

In step S102, when threshold voltage Vth attains the "0" lower foot level (V_0L) or higher, writing into this memory cell ends.

(Page Buffer of Flash Memory Having Memory Cells of SLCs)

Figure 3:
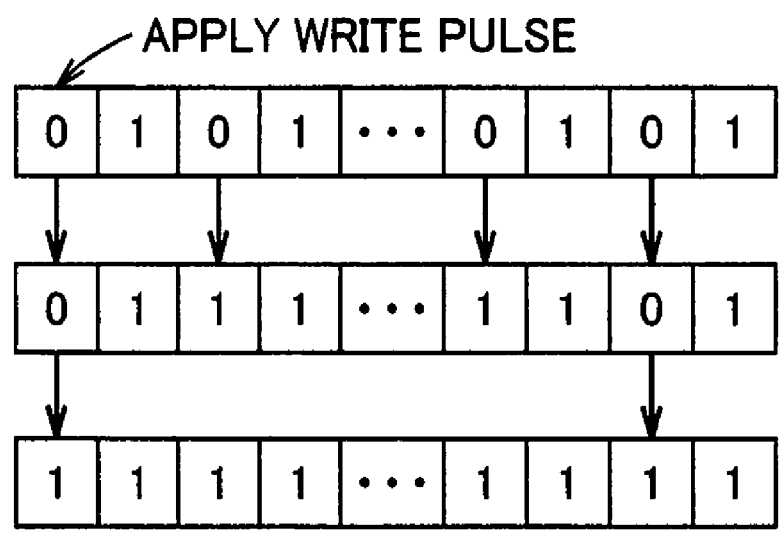
FIG. 3 illustrates changes in stored values of bits corresponding to the memory cells selected in a page buffer in a write sequence of a flash memory having memory cells of SLCs.

FIG. 3 illustrates changes in stored values of bits corresponding to the memory cells selected in a page buffer in a write sequence of a flash memory having a memory cell of SLC.

As illustrated in FIG. 3, each bit of the page buffer stores a pulse application instruction value deciding whether the write pulse is to be applied to the corresponding memory cell or not. When the pulse application instruction value is "0", the write pulse is applied. When the pulse application instruction value is "1", the write pulse is not applied.

The pulse application instruction value of each bit in the page buffer has an initial value, which is externally provided. The write pulse is applied to the memory cell corresponding to the pulse application instruction value of "0" so that threshold voltage Vth of the memory cell rises. When threshold voltage Vth of the memory cell attains the "0" lower foot level (V_0L) or higher, the writing into this memory cell ends, and the pulse application instruction value of the bit corresponding to this memory cell in the page buffer changes "1".

When the pulse application instruction values of all the bits in the page buffer finally attain "1", the writing into the flash memory ends.

(Nonvolatile Semiconductor Memory Device of First Embodiment)

Figure 4:
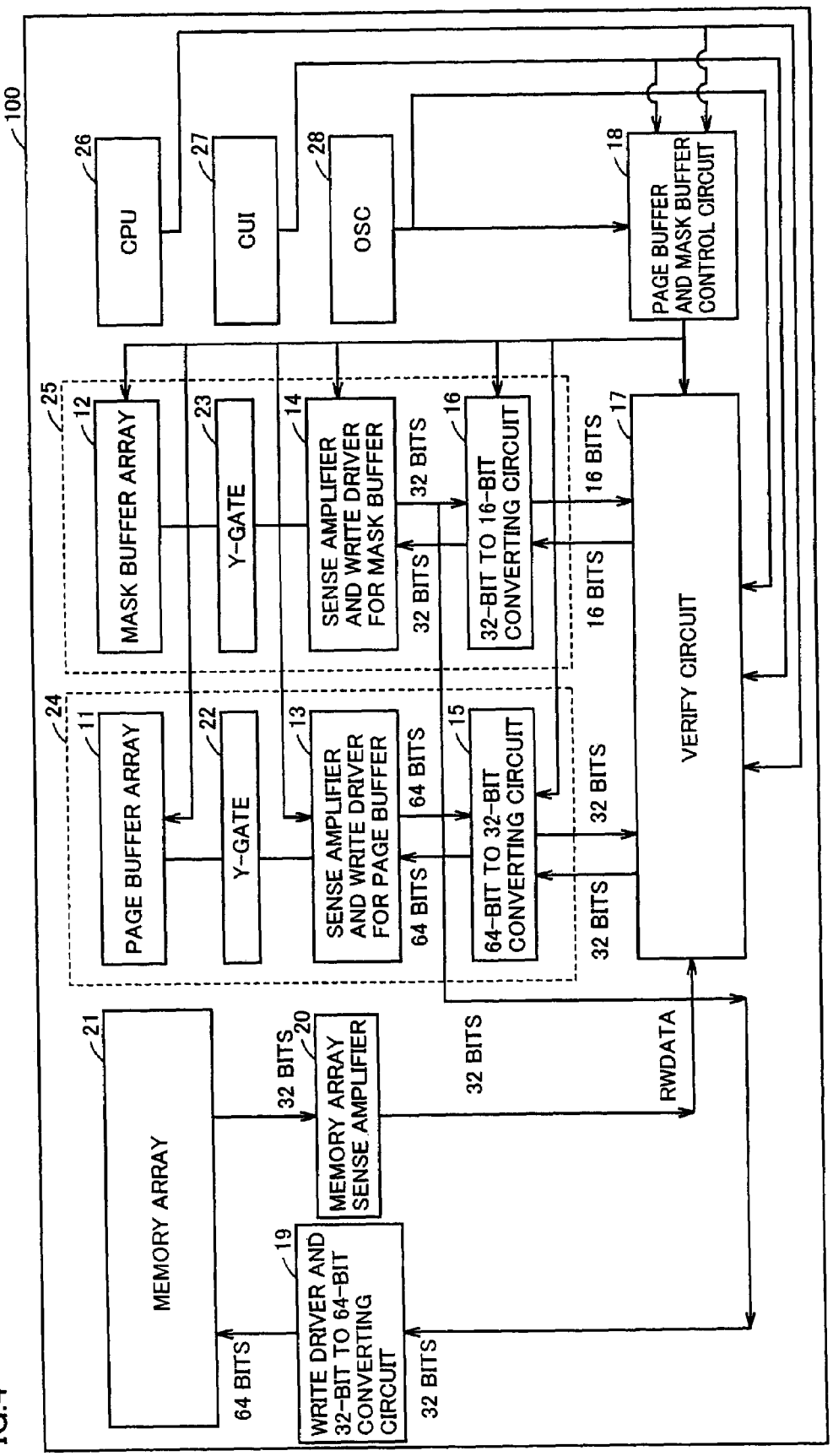
FIG. 4 is a block diagram showing a structure of a nonvolatile semiconductor memory device including memory cells of MLCs according to a first embodiment.

FIG. 4 is a block diagram showing a structure of a nonvolatile semiconductor memory device 100 having memory cells of MLCs according to a first embodiment. Referring to FIG. 4, nonvolatile semiconductor memory device 100 includes a memory array 21, a write driver and 32-bit to 64-bit converting circuit 19, a memory array sense amplifier 20 (i.e., sense amplifier for the memory cells), a page buffer and peripheral circuit group 24, a mask buffer and peripheral circuit group 25, a verify circuit 17, a page buffer and mask buffer control circuit 18 (i.e., control circuit for page and mask buffers), a CPU 26, a CUI 27 and an OSC 28.

OSC 28 produces an internal clock signal ICLK.

CPU 26 receives internal clock signal ICLK from OSC 28, and performs whole control of the nonvolatile semiconductor memory device.

CUI 27 receives externally applied data signals, and distributes them to various internal components.

Memory array 21 includes a plurality of memory cell transistors for the flash memories arranged in rows and columns. Each memory cell transistor is a MLC (Multi-Level Cell).

Figure 5:
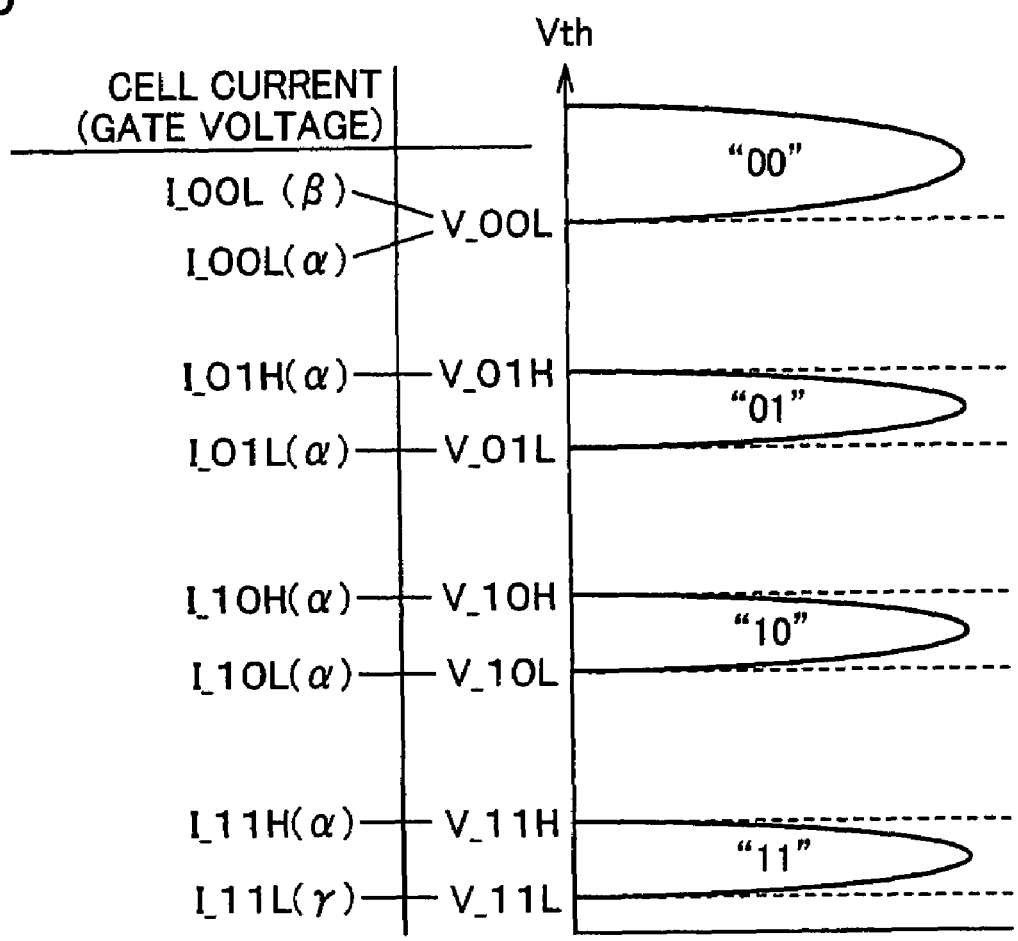
FIG. 5 illustrates a distribution of a threshold voltage Vth of memory cells of MLCs.

FIG. 5 illustrates a distribution of threshold voltage Vth of the memory cells of MLCs. In FIG. 5, an abscissa gives a frequency (i.e., the number of memory cells). As illustrated in FIG. 5, variations in threshold voltages are present in the memory cells. In view of such variations, therefore, a correspondence or relationship is defined between a threshold voltage of each memory cell and a logical value. More specifically, such a relationship is defined that a memory cell having a threshold voltage Vth in a range equal to or higher than a "11" lower foot (V_11L) and equal to or lower than a "11" upper foot (V_11H) corresponds to a logical value "11". A memory cell having a threshold voltage in a range equal to or higher than a "10" lower foot (V_10L) and equal to or lower than a "10" upper foot (V_10H) correspond to a logical value "10". Also, a memory cell having a threshold voltage Vth in a range equal to or higher than a "01" lower foot (V_01L) and equal to or lower than a "01" upper foot (V_01H) corresponds to a logical value "01", and a memory cell having a threshold voltage in a range equal to or higher than a "00" lower foot (V_00L) corresponds to a logical value "00". Therefore, the memory cells store quaternary data of "11", "10", "01" or "00" according to the threshold voltage.

An address decoder (not shown) selects a column of 32 memory cells in memory array 21.

Memory cell sense amplifier 20 determines the thresholds of the selected 32 memory cells, and provides first and second sense data in serial. For the lower foot verify, binary chop searching is effected to determine two times the range of the threshold voltage of each of the selected 32 memory cells according to sections of the threshold voltage for the lower foot verify, and thereby the logical value of two bits (first and second sense data) is provided. For the upper foot verify, binary chop searching is effected to determine two times the range of the threshold voltage of each of the selected 32 memory cells according to sections of the threshold voltage for the upper foot verify, and thereby the logical value of two bits (first and second sense data) are provided.

Page buffer and peripheral circuit group 24 includes a page buffer array 11, a Y-gate 22, a page buffer sense amplifier and write driver 13 (i.e., sense amplifier and write driver for the page buffer), and a 64-bit to 32-bit converting circuit 15.

Page buffer array 11 is formed of an SRAM (Static Random Access Memory), in which each cell holds a binary ("0" or "1"). Each cell in page buffer array 11 holds a write target value of a higher or lower bit of the corresponding memory cell in memory array 21.

Y-gate 22 connects the 64 cells in page buffer array 11, which correspond to the selected 32 memory cells in memory array 21, to page buffer sense amplifier and write driver 13.

Page buffer sense amplifier and write driver 13 amplifies the data of 64 bits, which are provided from the 64 cells in page buffer array 11 via Y-gate 22, and provides it to 64-bit to 32-bit converting circuit 15. Page buffer sense amplifier and write driver 13 writes the 64-bit data, which is provided from 64-bit to 32-bit converting circuit 15, into the 64 cells in page buffer array 11 via Y-gate 22.

64-bit to 32-bit converting circuit 15 provides the 64-bit data, which is provided from page buffer sense amplifier and write driver 13, to verify circuit 17 by performing the operation of providing 32 bits twice. 64-bit to 32-bit converting circuit 15 receives the data of 32 bits from verify circuit 17 in each providing operation, and prepares the data of 64 bits to provide it to page buffer sense amplifier and write driver 13 every time it receives the 32-bit data twice.

Mask buffer and peripheral circuit group 25 includes a mask buffer array 12, a Y-gate 23, mask buffer sense amplifier and write driver 14 (i.e., sense amplifier and write driver for mask buffer), and a 32-bit to 16-bit converting circuit 16.

Mask buffer array 12 has cells each holding a binary ("0" or "1"), and is formed of an SRAM. Each cell of mask buffer array 12 holds a pulse application instruction value for the corresponding memory cell.

Y-gate 23 connects the 32 cells in mask buffer array 12, which correspond to the 32 memory cells selected in memory array 21, to mask buffer sense amplifier and write driver 14.

Mask buffer sense amplifier and write driver 14 amplifies 32-bit data, which is provided from the 32 cells in mask buffer array 12 via Y-gate 23, and provides it to 32-bit to 16-bit converting circuit 16. Mask buffer sense amplifier and write driver 14 writes the 32-bit data, which is provided from 32-bit to 16-bit converting circuit 16, into the 32 cells in mask buffer array 12 via Y-gate 23.

32-bit to 16-bit converting circuit 16 provides the 32-bit data provided from mask buffer sense amplifier and write driver 14 to verify circuit 17 by performing the operation of providing 16 bits twice. 32-bit to 16-bit converting circuit 16 receives the 16-bit data provided from verify circuit 17 in each providing operation, and prepares 32-bit data to provide it to mask buffer sense amplifier and write driver 14 every time its receives the 16-bit data twice.

A 32-bit to 64-bit converting circuit unit in write driver and 32-bit to 64-bit converting circuit 19 provides the 64-bit data to a write driver unit every time it receives 32-bit data from mask buffer sense amplifier 14 twice. This conversion of 32-bit data to 64-bit data is performed for the purpose of increasing a writing speed by selecting 64 memory cells, which are targets in two read operations, in the operation of writing data into memory array 21. The write driver unit in write driver and 32-bit to 64-bit converting circuit 19 applies a write pulse, which is provided by a voltage control circuit (not shown), to the memory cell selected in memory array 21 when the data of each bit indicates the pulse application instruction value of "0".

Page buffer and mask buffer control circuit 18 controls verify circuit 17.

Verify circuit 17 performs dummy verify in addition to the lower foot verify and the upper foot verify.

The dummy verify is performed by producing a new write target value from a logical value stored in the memory cell of memory array 21 and a write target value externally applied to the page buffer, and transferring the new write target value thus produced to the page buffer array.

FIG. 6 illustrates the new write target values produced by the dummy verify from logical values stored in the memory cells and externally applied write target values. As illustrated in FIG. 6, the new write target value is an AND (logical product) between the logical value stored in the memory cell and the externally applied write target value. The AND is employed for the following reason.

When a logical value stored in the memory cell is "0", and an externally applied write target value is "0", it is not necessary to change the logical value of the memory cell from a current value so that the externally applied write target value of "0" can be used as the new write target value.

When the logical value stored in the memory cell is "1", and the externally applied write target value is "1", it is not necessary to change the logical value of the memory cell from the current value so that the externally applied write target value of "1" can be used as the new write target value.

Further, when the logical value stored in the memory cell is "1", and the externally applied write target value is "0", application of the write pulse can raise the threshold of the memory cell, and thereby can change the logical value of memory cell from "1" to "0". Therefore, the external applied write target value "0" is used as the new write target value.

However, when the logical value stored in the memory cell is "0", and the externally applied write target value is "1", application of the write pulse cannot lower the threshold of the memory cell, and therefore cannot change the logical value of memory cell from "0" to "1". Accordingly, the logical value "0", which is currently stored in the memory cell, is used as the new write target value.

Figure 7:
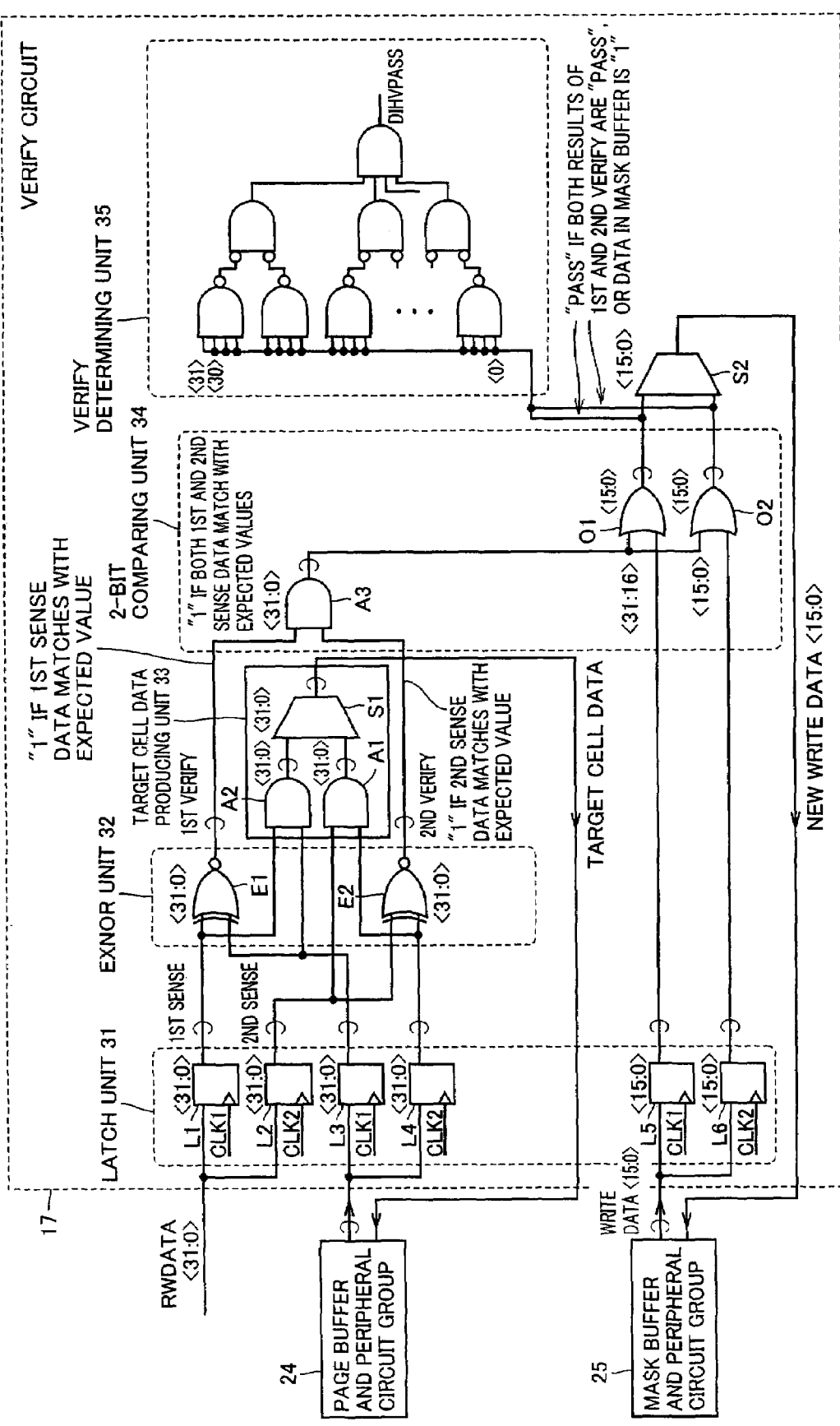
FIG. 7 shows a specific structure of a verify circuit 17.
Figure 17:
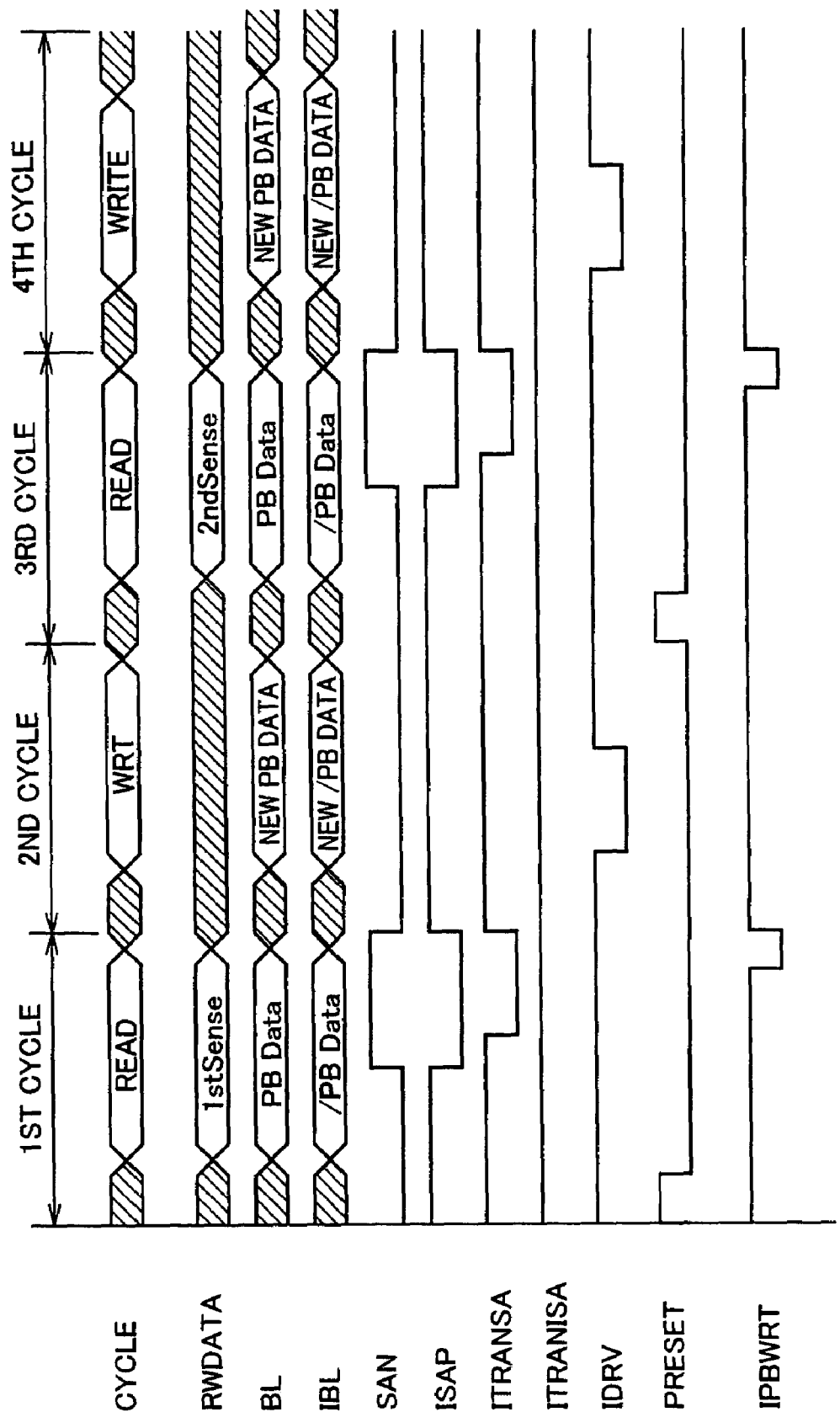
FIG. 17 is a timing chart illustrating dummy verify.

FIG. 7 shows a specific structure of verify circuit 17. Referring to FIG. 17, verify circuit 17 includes a latch unit 31, an EXNOR unit 32, a target cell data producing unit 32, a 2-bit comparing unit 34 and a verify determining unit 35.

Latch unit 31 latches the first sense data of 32 bits provided from memory array sense amplifier 20, the second sense data of 32 bits provided from memory array sense amplifier 20, the write target value of higher bits of 32 bits provided from page buffer array 11, the write target value of lower bits of 32 bits provided from page buffer array 11, and the pulse application instruction value of 32 bits provided from mask buffer array 12.

For each of the 32 bits, EXNOR unit 32 provides "1" as a first bit when the first sense data provided from latch unit 31 matches with the write target value of a higher bit provided from latch unit 31, and otherwise provides "0" as the first bit. For each of the 32 bits, EXNOR unit 32 provides "1" as a second bit when the second sense data provided from latch unit 31 matches with the write target value of the lower bit provided from latch unit 31, and otherwise provides "0" as the second bit.

For each of the 32 bits, 2-bit comparing unit 34 provides "1" when the first sense data matches with the write target value of the higher bit, and the second sense data matches with the write target value of the lower bit, or when the pulse application instruction value is "1". These outputs "1" are provided to the corresponding bits in mask buffer array 12 by performing twice the operation of providing 16 bits selected by a selector S2.

Verify determining unit 35 provides a verify determination signal DIHVPASS indicating "pass" of the verify only when all the 32-bit data provided from 2-bit comparing unit 34 are "1".

For each of the 32 bits, a target cell data producing unit 33 obtains an AND of the first sense data provided from latch unit 31 and the write target value of the higher bit provided from latch unit 31. This AND is provided to the corresponding bit in page buffer array 11. For each of the 32 bits, target cell data producing unit 33 obtains an AND of the second sense data provided from latch unit 31 and the write target value of the lower bit provided from latch unit 31. This AND is provided to the corresponding bit in page buffer array 11.

(Write Sequence)

Figure 8:
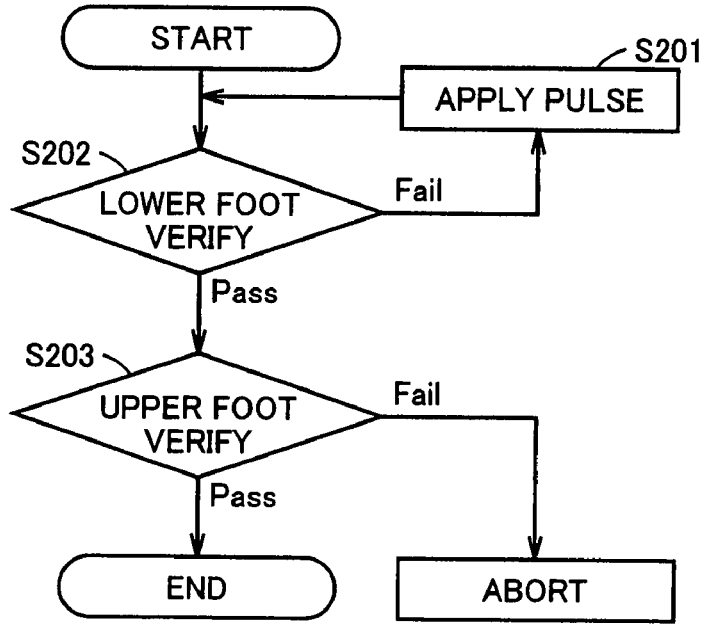
FIG. 8 is a flowchart representing a write sequence in the first embodiment.

A write sequence of the nonvolatile semiconductor memory device according to the embodiment will now be described. FIG. 8 is a flowchart illustrating the write sequence in the first embodiment.

In a step S201 illustrated in FIG. 8, the pulse application instruction value of 32 bits corresponding to the 32 memory cells selected in mask buffer array 12 is provided to write driver and 32-bit to 64-bit converting circuit 19 via mask buffer sense amplifier unit 14 and a write data bus WDATA. The write driver unit in write driver and 32-bit to 64-bit converting circuit 19 applies the write pulse, which is produced by a voltage control circuit (not shown), to the memory cell corresponding to the bit of the pulse application instruction value of "0".

In a step S202, the lower foot verify of threshold voltage Vth of the 32 selected memory cells is performed as follows.

First, it is determined whether threshold voltage Vth is equal to or higher than "01" lower foot level (=V_01L) or not. More specifically, memory array sense amplifier 20 detects a current amount Im, which is achieved when a verify voltage (=α) is applied to each memory cell. Memory array sense amplifier 20 determines whether detected current amount Im is equal to or smaller than current value Is (=I_01L), which is achieved when threshold voltage Vth is at the "01" lower foot level (=V_01L), or not. When current amount Im is equal to or smaller than current value Is, memory array sense amplifier 20 provides "0" as the first sense data to verify circuit 17 via a read data bus RDATA. When current amount Im is larger than current value Is, memory array sense amplifier 20 provides "1" as the first sense data to verify circuit 17 via a read data bus RDATA.

When current amount Im is equal to or smaller than current value Is, it is further determined whether threshold voltage Vth is equal to or higher than the "00" lower foot level (=V_00L) or not. More specifically, memory array sense amplifier 20 detects current amount Im, which is achieved when the verify voltage (=α) is applied to the memory cell. Memory array sense amplifier 20 determines whether detected current amount Im is equal to or smaller than current value Is (=I_01L), which is achieved when threshold voltage Vth is at the "00" lower foot level (=V_00L), or not. When current amount Im is equal to or smaller than current value Is, memory array sense amplifier 20 provides "0" as a second sense data to verify circuit 17 via read data bus RDATA. When current amount Im is larger than current value Is, memory array sense amplifier 20 provides "1" as the second sense data to verify circuit 17 via read data bus RDATA.

When current amount Im exceeds current value Is, it is determined whether threshold voltage Vth is equal to or higher than the "10" lower foot level (=V_10L) or not. More specifically, memory array sense amplifier 20 detects current amount Im, which is achieved when the verify voltage (=α) is applied to the memory cell. Memory array sense amplifier 20 determines whether detected current amount Im is equal to or smaller than current value Is (=I_10L), which is achieved when threshold voltage Vth is at the "10" lower foot level (=V_10L), or not. When current amount Im is equal to or smaller than current value Is, memory array sense amplifier 20 provides "0" as the second sense data to verify circuit 17 via read data bus RDATA. When current amount Im is larger than current value Is, memory array sense amplifier 20 provides "1" as the second sense data to verify circuit 17 via read data bus RDATA.

The write target values of the higher and lower bits of the selected 32 memory cells held in page buffer array 11 are provided to 64-bit to 32-bit converting circuit 15 via Y-gate 22 and page buffer sense amplifier 13.

64-bit to 32-bit converting circuit 15 first provides the write target values of the higher bits of the 32 bits to verify circuit 17. Verify circuit 17 determines for each bit whether the first sense data matches with the write target value of the higher bit or not. Then, 64-bit to 32-bit converting circuit 15 provides the write target values of the lower bits of the 32 bits to verify circuit 17. Verify circuit 17 determines for each bit whether the second sense data matches with the write target value of the lower bit or not.

When the first sense data matches with the write target value of the higher bit, and the second sense data matches with the write target value of the lower bit, verify circuit 17 sets the corresponding bit in mask buffer array 12 to "1".

For all the 32 bits, when the first sense data matches with the write target value of the higher bit, and the second sense data matches with the write target value of the lower bit, verify circuit 17 provides verify determination signal DIHVPASS representing "pass" or success of the lower foot verify to CPU 26, and CPU 26 moves the processing to a step S203. When mismatching occurs, verify circuit 17 provides, for all the 32 bits, verify determination signal DIHVPASS representing failure of the lower foot verify to CPU 26, and CPU 26 repeats the steps S201 and S202.

In step S203, the upper foot verify of threshold voltage Vth of the selected 32 memory cells is performed as follows.

First, it is determined whether threshold voltage Vth is equal to or lower than "10" upper foot level (=V_10H) or not. More specifically, memory array sense amplifier 20 detects current amount Im, which is achieved when the verify voltage (=α) is applied to each memory cell. Memory array sense amplifier 20 determines whether detected current amount Im is equal to or larger than current value Is (=I_10H), which is achieved when threshold voltage Vth is at the "10" upper foot level (=V_10H), or not. When current amount Im is equal to or larger than current value Is, memory array sense amplifier 20 provides "1" as the first sense data to verify circuit 17 via read data bus RDATA. When current amount Im is smaller than current value Is, memory array sense amplifier 20 provides "0" as the first sense data to verify circuit 17 via read data bus RDATA.

When current amount Im is smaller than current value Is, it is further determined whether threshold voltage Vth is equal to or lower than "01" upper foot level (=V_010H) or not. More specifically, memory array sense amplifier 20 detects current amount Im, which is achieved when the verify voltage (=α) is applied to each memory cell. Memory array sense amplifier 20 determines whether detected current amount Im is equal to or larger than current value Is (=I_10H), which is achieved when threshold voltage Vth is at the "01" upper foot level (=V_01H), or not. When current amount Im is equal to or larger than current value Is, memory array sense amplifier 20 provides "1" as the second sense data to verify circuit 17 via read data bus RDATA. When current amount Im is smaller than current value Is, memory array sense amplifier 20 provides "0" as the second sense data to verify circuit 17 via read data bus RDATA.

When current amount Im is equal to or larger than current value Is, it is further determined whether threshold voltage Vth is equal to or lower than "01" upper foot level (=V_11H) or not. More specifically, memory array sense amplifier 20 detects current amount Im, which is achieved when the verify voltage (=α) is applied to each memory cell. Memory array sense amplifier 20 determines whether detected current amount Im is equal to or larger than current value Is (=I_{13} 11H), which is achieved when threshold voltage Vth is at the "11" upper foot level (=V_11H), or not. When current amount Im is equal to or larger than current value Is, memory array sense amplifier 20 provides "1" as the second sense data to verify circuit 17 via read data bus RDATA. When current amount Im is smaller than current value Is, memory array sense amplifier 20 provides "0" as the second sense data to verify circuit 17 via read data bus RDATA.

The write target values of the higher and lower bits of the selected 32 memory cells held in page buffer array 11 are provided to 64-bit to 32-bit converting circuit 15 via Y-gate 22 and page buffer sense amplifier 13.

64-bit to 32-bit converting circuit 15 first provides the write target values of the higher bits of the 32 bits to verify circuit 17. Verify circuit 17 determines for each bit whether the first sense data matches with the write target value of the higher bit or not. Then, 64-bit to 32-bit converting circuit 15 provides the write target values of the lower bits of the 32 bits to verify circuit 17. Verify circuit 17 determines for each bit whether the second sense data matches with the write target value of the lower bit or not.

For all the 32 bits, when the first sense data matches with the write target value of the higher bit, and the second sense data matches with the write target value of the lower bit, verify circuit 17 provides verify determination signal DIHV-PASS representing "pass" or success of the upper foot verify to CPU 26, and CPU 26 ends the write sequence for the memory cell. When mismatching occurs, verify circuit 17 provides, for all the 32 bits, verify determination signal DIH-VPASS representing "fail" of the upper foot verify to CPU 26, and CPU 26 abnormally ends the write sequence.

(Transition of Each Bit in Page Buffer and Mask Buffer)

Figure 9A:
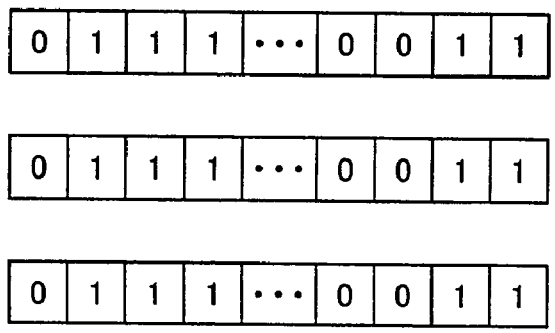
FIGS. 9A and 9B illustrate changes in stored values of bits corresponding to the selected memory cells in a page buffer array 11 and a mask buffer array 12 in a write sequence.
Figure 9B:
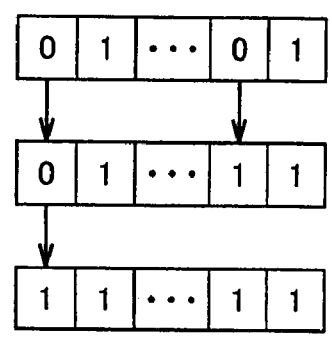

FIGS. 9A and 9B illustrate transition of the bits corresponding to the selected memory cells in page buffer array 11 and mask buffer array 12 in the write sequence. As illustrated in FIGS. 9A and 9B, the 32 bits of the mask buffer array hold the pulse application instruction values determining whether the write pulse is to be applied to the corresponding 32 memory cells or not, and change in the write sequence. When the pulse application instruction value is "0", the write pulse is applied. When the pulse application instruction value is "1", the write pulse is not applied.

The write pulse is applied to the memory cell when the corresponding pulse application instruction value in mask buffer array 12 is "0", and threshold voltage Vth of the memory cell rises. When the result of the lower foot verify of threshold voltage Vth in a certain memory cell is "pass", the writing into this memory cell ends, and the pulse application instruction value in mask buffer array 12 corresponding to this memory cell is changed into "1".

Finally, the write sequence ends when all the pulse application instruction values stored in the 32 bits, which correspond to the selected 32 memory cells, respectively, in mask buffer array 12 become "1".

The write target values of the higher and lower bits to be written into each memory cell are held by the corresponding two bits in page buffer array 11, and these two bits corresponding to each memory cell do not change in the write sequence.

For the lower foot verify, two bits (higher and lower bits) in page buffer array 11 are compared with two bits (first and second sense data) for the lower foot verify provided from memory array sense amplifier 20. When these match with each other, it is determined that the result of the lower foot verify of the corresponding memory cell is "pass". When mismatching occurs, it is determined that the lower foot verify of the corresponding memory cell failed.

In the upper foot verify, the two bits (upper and lower bits) in page buffer array 11 are compared with the two bits (first and second sense data) for the upper verify provided from memory array sense amplifier 20. When these match with each other, it is determined that the result of the upper foot verify of the corresponding memory cell is "pass". When mismatching occurs, it is determined that the upper foot verify of the memory cell failed.

(Operation for Lower Foot Verify)

A specific operation of for the lower foot verify in verify circuit 17 will now be described.

First, memory array sense amplifier 20 provides the first sense data for 32 bits onto read data bus RDATA. A latch L1 in latch unit 31 holds the first sense data for the 32 bits in synchronization with clock CLK1. Page buffer array 11 provides the write target values of the higher bits for the 32 bits, and a latch L3 in latch unit 31 holds the write target values of the higher bits for the 32 bits in synchronization with clock CLK1.

Then, memory array sense amplifier 20 provides the second sense data for the 32 bits onto read data bus RDATA. A latch L2 in latch unit 31 holds the second sense data for the 32 bits in synchronization with a clock CLK2. Page buffer array 11 provides the write target values of the lower bits for the 32 bits, and a latch L4 in latch unit 31 holds the write target values of the lower bits for the 32 bits in synchronization with clock CLK2.

An inversion-EXOR circuit E1 in EXNOR unit 32 receives the outputs of latches L1 and L3. For each bit, inversion-EXOR circuit E1 provides "1" when the first sense data matches with the write target value of the higher bit, and provides "0" when mismatching occurs. An inversion-EXOR circuit E2 in EXNOR unit 32 receives the outputs of latches L2 and L4. For each bit, inversion-EXOR circuit E2 provides "1" when the second sense data matches with the write target value of the lower bit, and provides "0" when mismatching occurs.

An AND circuit A3 in 2-bit comparing unit 34 receives the outputs of inversion-EXOR circuits E1 and E2, and provides "1" for each bit only when the first sense data matches with the write target value of the higher bit, and the second sense data matches with the write target value of the lower bit.

Mask buffer array 12 provides the pulse application instruction values for the 16 bits formed of 16th to 31st bits, and a latch L5 in latch unit 31 holds the pulse application instruction values for the 16 bits formed of 16th to 31st bits in synchronization with clock CLK1. An OR circuit O1 of 2-bit comparing unit 34 receives the outputs of AND circuit A3 for the 16 bits formed of 15th to 31st bits as well as an output of latch L5, and provides "1" for each bit when the first sense data matches with the write target value of the higher bit, and the second sense data matches with the write target value of the lower bit, or when the pulse application instruction value is "1" (completion of write). Selector S2 selects the output of OR circuit O1, and provides it to the 16th to 31st bits in mask buffer array 12.

Then, mask buffer array 12 provides the pulse application instruction values for the 16 bits formed of 0th to 15th bits, and a latch L6 in latch unit 31 holds the pulse application instruction values for the 16 bits formed of 0th to 15th bits in synchronization with clock CLK2. An OR circuit O2 in 2-bit comparing unit 34 receives the outputs of AND circuit A3 for the 16 bits formed of 0th to 15th bits as well as the output of latch L6, and provides "1" for each bit when the higher bit of the first sense data matches with the write target value, and the second sense data matches with the write target value of the lower bit, or when the pulse application instruction value is "1" (completion of writing). Selector S2 selects the output of OR circuit O2, and provides it to the 0th to 15th bits in mask buffer array 12.

Verify determining unit 35 receives the outputs of OR circuits O1 and O2, and provides verify determination signal DIHVPASS of "1" when such a relationship is obtained for all the 32 bits that the higher bit of the first sense data matches with the write target value of the higher bit, and the second sense data matches with the write target value of the lower bit, or when the pulse application instruction value is "1" (completion of writing).

(Operation for Upper Foot Verify)

The first and second sense data, which are provided from memory array sense amplifier 20 in the upper verify operation, are different from those in the lower foot verify operation as already described. However, the operation of the upper verify in verify circuit 17 is substantially the same as that of the lower foot verify. Therefore, description of the operation for the upper foot verify in verify circuit 17 is not repeated.

(Operation for Dummy Verify)

Specific operations for the dummy verify in verify circuit 17 will be described.

Memory array sense amplifier 20 provides the first sense data for the 32 bits onto read data bus RDATA. Latch L1 in latch unit 31 holds the first sense data for the 32 bits in synchronization with clock CLK1. Page buffer array 11 provides the write target value of the higher bits for the 32 bits, and latch L3 in latch unit 31 holds the write target value of the higher bits for the 32 bits in synchronization with clock CLK1.

An AND circuit A2 in target cell data producing unit 33 receives the outputs of latches L1 and L3, and provides "1" for each bit when both the first sense data and the write target value of the higher bit are "1". A selector S1 provides the output of AND circuit A2 to the bit, in which the write target value of the higher bit of page buffer array 11 is stored.

Memory array sense amplifier 20 provides the second sense data for the 32 bits onto read data bus RDATA. Latch L2 in latch unit 31 holds the second sense data for the 32 bits in synchronization with clock CLK2. Page buffer array 11 provides the write target value of the lower bits for the 32 bits, and latch L4 in latch unit 31 holds the write target value of the lower bits for the 32 bits in synchronization with clock CLK2.

An AND circuit A1 of target cell data producing unit 33 receives the outputs of latches L2 and L4, and provides "1" for each bit when the both the lower bit of the second sense data and the write target value are "1". Selector S1 provides the output of AND circuit A1 to the bit, in which the write target value of the lower bit in page buffer array 11 is stored.

As described above, the nonvolatile semiconductor memory device according to the first embodiment includes the two buffers, i.e., the mask buffer and page buffer, and is configured such that the pulse application instruction value in the mask buffer is changed when the result of the lower foot verify is "pass", but the write target value in the page buffer does not change even in such a case. Therefore, the device can perform not only the lower foot verify but also the upper foot verify, and can appropriately perform the verify when multi-valued writing is effected on the nonvolatile memory cell transistors.

Second Embodiment

This embodiment relates to a nonvolatile semiconductor memory device, which has a mask buffer and a page buffer similarly to the first embodiment, and can operate fast with a small area.

(Whole Structure)

Figure 10:
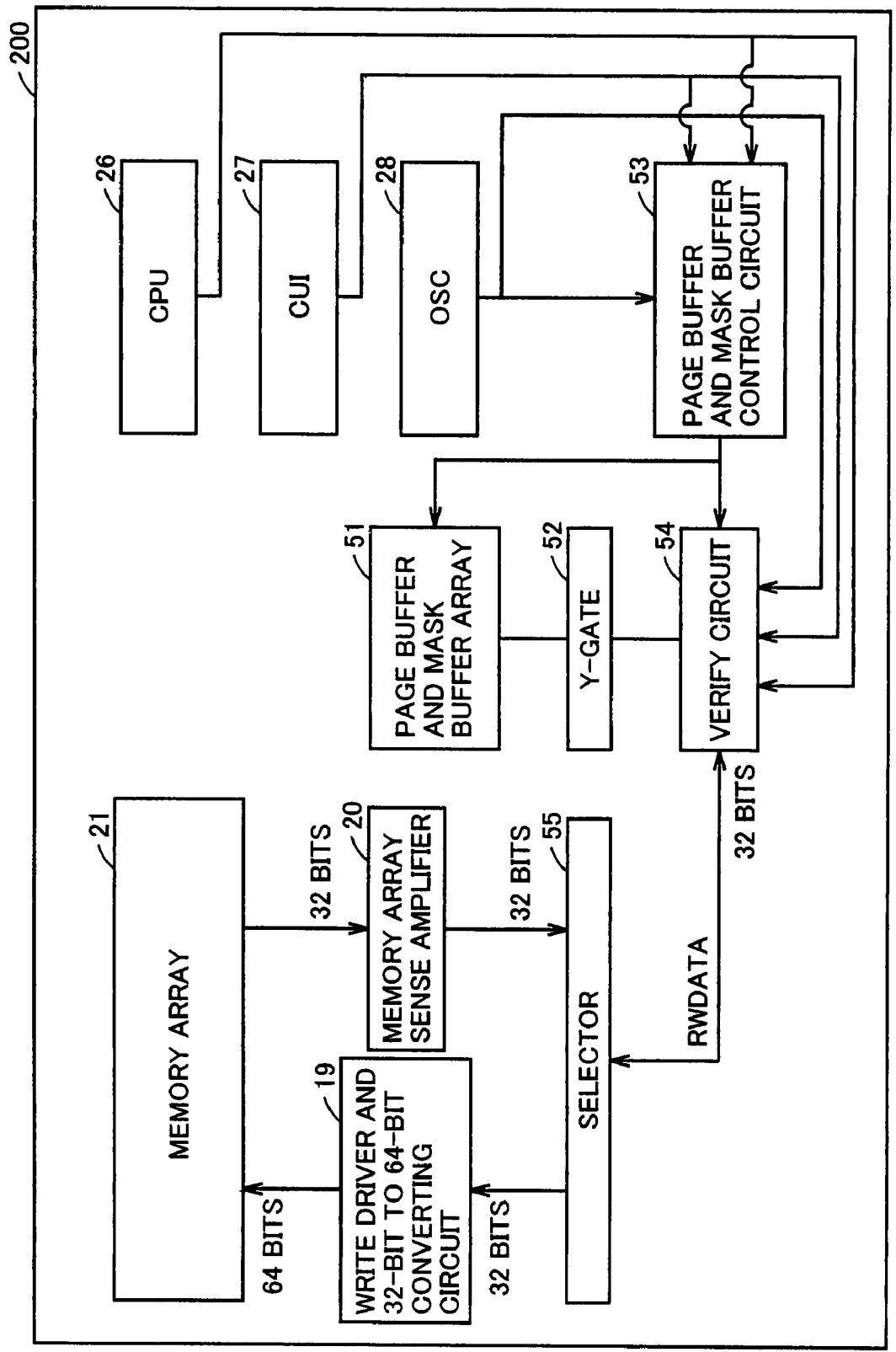
FIG. 10 is a block diagram showing a structure of a nonvolatile semiconductor memory device according to a second embodiment of the invention.

FIG. 10 is a block diagram illustrating a structure of a nonvolatile semiconductor memory device according to a second embodiment. Referring to FIG. 10, the nonvolatile semiconductor memory device includes memory array 21, write driver and 32-bit to 64-bit converting circuit 19, memory array sense amplifier 20, a selector 55, a page buffer and mask buffer array 51, a Y-gate 52, a verify circuit 54, a page buffer and mask buffer control circuit 53 (i.e., control circuit for the page buffer and mask buffer), CPU 26, CUI 27 and OSC 28.

Memory array 21, write driver and 32-bit to 64-bit converting circuit 19, memory array sense amplifier 20 are the same as those in the first embodiment, and description thereof is not repeated.

CUI 27 receives an externally applied data signal, and distributes it to various internal components.

OSC 28 produces internal clock signal ICLK of a period corresponding to a set value of a register, which can be externally set, although not shown.

CPU 26 receives internal clock signal ICLK from OSC 28, and performs whole control of the nonvolatile semiconductor memory device.

Page buffer and mask buffer array 51 has a page buffer unit and a mask buffer unit. The page buffer unit and the mask buffer unit are substantially the same as the page buffer and the mask buffer in the first embodiment, respectively. For the lower foot verify, each bit in the mask buffer unit stores the pulse application instruction value, which determines whether the write pulse is to be applied to the corresponding memory cell or not, similarly to the first embodiment. When the pulse application instruction value is "0", this represents that the writing is incomplete, i.e., the result of the verify is not "pass". When the pulse application instruction value is "1", this represents that the writing is completed, i.e., the result of the verify is "pass". Each bit in the mask buffer unit stores the value determining, in the upper foot verify operation, whether it is to be decided that the result of the verify is "pass" or not, independently of the result of the upper foot verify of the corresponding memory cell. When the value is "1", it is automatically decided that the result of the verify is "pass". In the second embodiment, therefore, the data of the mask buffer unit is referred to as a verify determination value, instead of the pulse application instruction value.

Y-gate 52 is connected to verify circuit 54 in the selected column of page buffer and mask buffer array 51.

Memory array sense amplifier 20 transfers the first and second sense data in serial to verify circuit 54 through a read/write data bus RWDATA.

In the write operation, verify circuit 54 transfers the value held in the mask buffer unit via read/write data bus RWDATA to the write driver unit in write driver and 32-bit to 64-bit converting circuit 19.

Therefore, read/write data bus RWDATA, which serves as both the read bus and the write bus, makes a connection between verify circuit 54 and write driver and 32-bit to 64-bit converting circuit 19 as well as a connection between verify circuit 54 and memory array sense amplifier 20.

Selector 55 selects the transfer of data from verify circuit 54 to the write driver and 32-bit to 64-bit converting circuit 19 or the transfer of data from memory array sense amplifier 20 to verify circuit 54.

Figure 11:
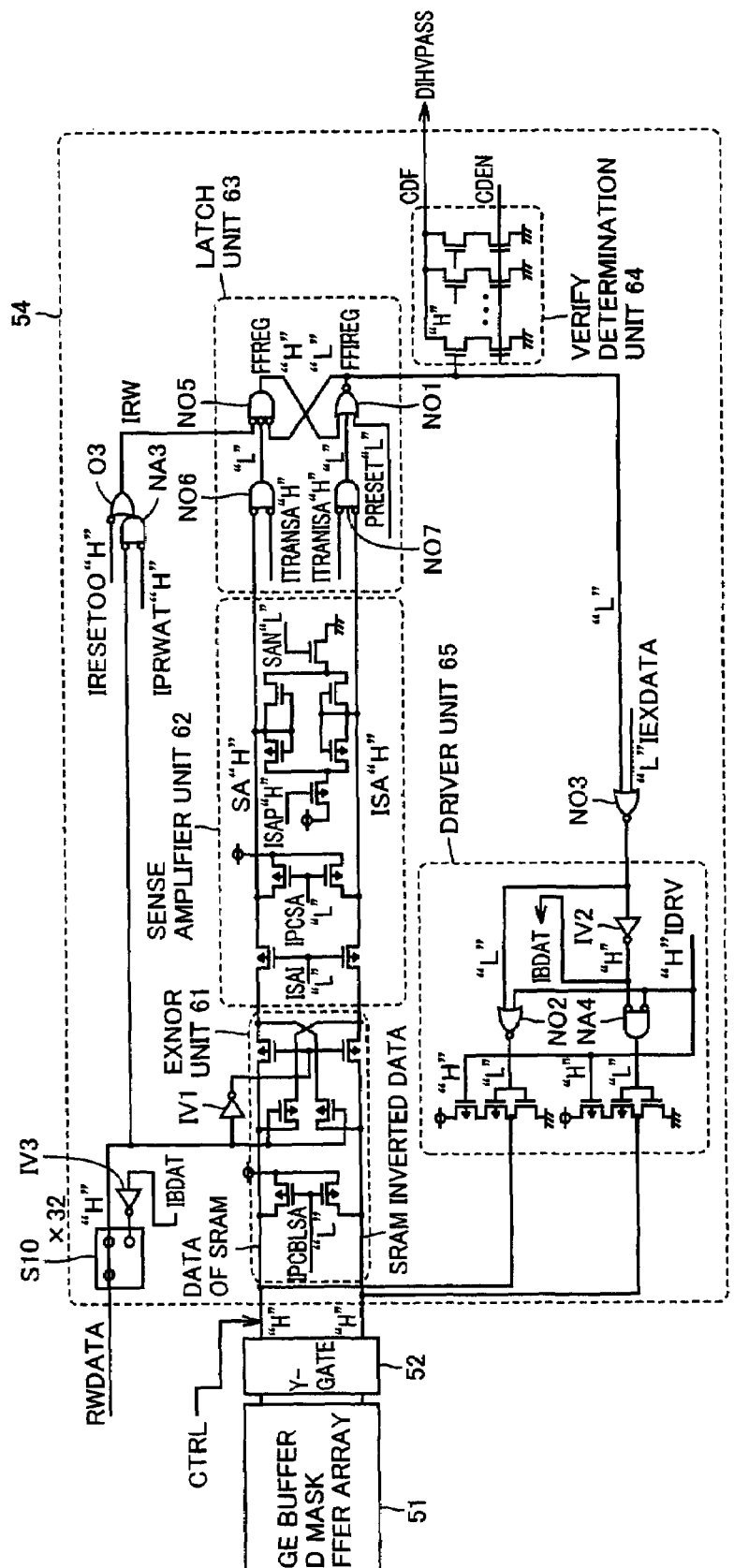
FIG. 11 shows a specific structure of a verify circuit 54.

Page buffer and mask buffer control circuit 53 produces signals controlling verify circuit 54 in FIG. 11 based on internal clock signal ICLK produced by OSC 28, and more specifically, produces various signals such signals (SAN and ISAP) controlling amplification of the bit line pair by a sense amplifier unit 62 in verify circuit 54, signals (IPCBL_SA and IPCSA) controlling precharging of the bit line pair in verify circuit 54, signals (ITRANSA, ITRANISA, PRESET, IRESET00 and IPBWRT) controlling the latch of the bit line pair in a latch unit 63 in the verify circuit, a signal (ISAI) controlling connection between sense amplifier unit 62 and an EXNOR unit 61, and a signal IDRV for transferring the data of latch unit 63 to the page or mask buffer unit. Page buffer and mask buffer control circuit 53 provides these signals to verify circuit 54

Similarly to the first embodiment, verify circuit 54 has functions of the lower foot verify, upper foot verify and dummy verify, and further has functions of pulse check verify, 00-data transfer, 11-data transfer, mask buffer data transfer, flash-to-page buffer transfer and flash-to-page buffer inversion transfer.

The pulse check verify is used for determining whether the width or magnitude of increase in write pulse voltage can be increased or not, and particularly is used for confirming that there is no memory cell in such a state (i.e., first state) that the first sense data is "1" (i.e., threshold voltage Vth of the memory cell is lower than "01" lower foot level) and the pulse application instruction value of mask buffer 51 is "0" (write target). When the memory cell in the first state is not present, the selected memory cell is in one of the following second, third and fourth states. In the second state, threshold Vth is lower than the "01" lower foot level, and the verify determination value is "1" (completion of writing). In the third state, threshold Vth is equal to or higher than the "01" lower foot level, and the verify determination value is "1" (completion of writing). In the fourth state, threshold Vth is equal to or higher than the "01" lower foot level, and the verify determination value is "0" (incompletion of writing).

In the first state, the write target value is "10", "01" or "00", and the threshold is low so that it is necessary to increase gradually the threshold to a desired threshold. Therefore, it is not appropriate to increase the magnitude of increase in write pulse voltage.

In the second and third states, the writing is completed so that the write pulse is not applied, and the magnitude of increase in write pulse voltage can be increased without any problem.

In the fourth state, the write target value is "00" for the following reason. If the write target value is "01", the verify determination value must be "1" (completion of writing) when threshold Vth is equal to or higher than "01" lower foot level. When the write target value is "00", an upper end of the threshold is not limited so that the magnitude of increase in write pulse voltage can be increased without any problem, and such increase can achieve rapid writing of the data into the memory cells.

When there is no memory cell in the first state, the result of the pulse check verify is "pass", and the degree of increase of the write pulse voltage is increased from 0.1 V to 0.2 V.

According to the 00-data transfer, the data is transferred to the mask buffer unit when the result of the pulse check verify or lower foot verify is "pass", and particularly in such a manner that, when the write target value in the page buffer unit corresponding to each memory cell selected in memory array 21 is "00" (i.e., the write target values of higher and lower bits are equal to "0" and "0", respectively), the bit in the mask buffer unit corresponding to the memory cell in question may become "0", or in such a manner that, when the write target value is "10", "01" or "11", the bit in the mask buffer unit corresponding to the memory cell may become "1". Thereby, the memory cell, to which the write pulse is to be applied, can be restricted to the memory cell, of which write target value is "00". Thereby, even when the write target value is "00", and the result of the lower foot verify is "pass", the memory cell in this state is handled as the memory cell, to which the write pulse is further to be applied, in view of the following fact. When the write pulse voltage is increased by 0.2 V, the verify voltage is also increased from α to β. Therefore, even in the case where the result of the lower foot verify was "pass" with the verify voltage of α, the lower foot verify may fail with the verify voltage increased to β. In view of this, the memory cell is handled as described above.

According to the 11-data transfer, the data is transferred to the mask buffer unit in such a manner that, when the write target value in the page buffer unit corresponding to each memory cell selected in memory array 21 is "11" (i.e., the write target values of higher and lower bits are equal to "1" and "1", respectively), the bit in the mask buffer unit corresponding to the memory cell in question may become "1", and in such a manner that, when the write target value is "10", "01" or "11", the bit in the mask buffer unit corresponding to the memory cell may become "0". Thereby, when the write target value is "11", and the memory cell is not the write target, the upper foot verify of this memory cell is automatically decided as "pass".

According to the mask buffer data transfer, the bit in the mask buffer unit corresponding to each memory cell selected in memory array 21 is transferred to the write driver unit. Thereby, verify circuit 54 can once take in the data transferred to the mask buffer unit, and then can provide it to the write driver unit. Therefore, bus RWDATA, which transmits the data from memory array sense amplifier 20 to verify circuit 54, can also transmit the data to the write driver unit.

According to flash to page buffer transfer, a 2-bit logical value stored in each memory cell selected in memory array 21 is transferred to corresponding two bits in the page buffer unit.

According to flash to page buffer inversion transfer, an inverted value of a 2-bit logical value stored in each memory cell selected in memory array 21 is transferred to corresponding two bits in the page buffer unit.

(Specific Structure of Verify Circuit 54)

FIG. 11 shows a specific structure of verify circuit 54. Referring to FIG. 11, verify circuit 54 includes EXNOR unit 61, sense amplifier unit 62, latch unit 63, a verify determining unit 64, a driver unit 65, a selector S10, inverters IV1 and IV3, an inverted OR circuit NO3, an inverted AND circuit NA3 and an OR circuit O3.

Inverter IV1 inverts the level of the data of read/write data bus RWDATA, and provides it to EXNOR unit 61.

EXNOR unit 61 receives the data of bit line pair BL and IBL as well as read/write data bus RWDATA. EXNOR unit 61 provides "1" level (unamplified data) and "0" level (unamplified data) onto bit lines BL and IBL, respectively, when the level of data on bit line BL matches with the level of read/write data bus RWDATA. When mismatching occurs, EXNOR unit 61 provides "0" level (unamplified data) and "1" level (unamplified data) onto bit lines BL and IBL, respectively.

EXNOR unit 61 includes a transistor for precharging, which is connected to control signal IPCBL_SA. When control signal IPCBL_SA attains "0", bit line pair BL and IBL is precharged.

Sense amplifier unit 62 amplifies the data on bit line pair BL and IBL provided from EXNOR unit 61, and provides a sense amplifier amplified signal SA and an inverted sense amplifier amplified signal ISA to bit lines BL and IBL, respectively. Sense amplifier unit 62 becomes active when control signals SAN and ISAP become "1" and "0", respectively.

Sense amplifier unit 62 includes a transistor for isolation, which is connected to control signal ISAI. The transistor connected to control signal ISAI is provided for isolating EXNOR unit 61 from sense amplifier unit 62. When EXNOR unit 61 is precharging bit line pair BL and IBL, control signal ISAI becomes "1" to isolate EXNOR unit 61 from sense amplifier unit 62, and sense amplifier unit 62 thus isolated amplifies the data on bit line pair BL and IBL provided from EXNOR unit 61. This reduces the time taken for the sense amplifier processing.

Sense amplifier unit 62 includes a transistor for precharging connected to control signal IPCSA. When control signal IPCSA becomes "0", sense amplifier unit 62 precharges sense amplifier amplified signal SA and inverted sense amplifier amplified signal ISA to "1".

Inverted OR circuit NO3 receives the data on a FFIREG node and external data IEXDATA, and provides an inverted OR of them to driver unit 65. During an internal operation such as a verify operation, external data IEXDATA is fixed to "0". During the external operation, the FFIREG node is set to "0" so that external data IEXDATA becomes valid.

Inverted AND circuit NA3 receives the data on read/write data bus RWDATA and a take-in instructing signal IPBWRT, and provides an inverted AND of them to OR circuit O3.

OR circuit O3 receives the output of inverted AND circuit NA3 and an inverted value of reset signal IRESET00, and provides an OR of them to an inverted OR circuit NO5.

Latch unit 63 receives sense amplifier amplified signal SA and inverted sense amplifier amplified signal ISA, and latches the logical value corresponding to the levels of sense amplifier amplified signal SA and inverted sense amplifier amplified signal ISA. Latch unit 63 includes inverted OR circuits NO6, NO7 and NO1.

Inverted OR circuit NO6 receives the data on bit line BL and amplification take-in signal ITRANSA, and provides an inverted OR of them to inverted OR circuit NO5.

Inverted OR circuit NO5 receives the output of inverted OR circuit NO6 and data on output node FFIREG of inverted OR circuit NO1, and provides an inverted OR of them to a node FFREG Inverted OR circuit NO7 receives the data on bit line IBL and inverted amplification take-in signal ITRANISA, and provides an inverted OR of them to inverted OR circuit NO1.

Inverted OR circuit NO1 receives the output of inverted OR circuit NO7, preset signal PRESET and data on output node FFREG of inverted OR circuit NO5, and provides an inverted OR of them to node FFIREG.

Verify determining unit 64 is connected to the FFIREG node in latch unit 63, and provides a verify determination signal DIHVPASS, which represents a result of verify determination based on the latch data on the FFIREG node, to CPU 26.

Driver unit 65 receives the data on the FFIREG node in latch unit 63 via inverted OR circuit NO3 during an internal operation, and provides data, which is prepared by inverting the level of the data on the FFIREG node, and the data on the FFIREG node onto bit lines BL and IBL, respectively. The data on bit line pair BL and IBL are written into corresponding bits in page buffer and mask buffer array 51.

Driver unit 65 provides the data on the FFIREG node to inverter IV3 via a data line IBDAT. The data provided to inverter IV3 is transmitted to read/write data bus RWDATA via selector S10, and is written into memory array 21.

During an external operation, driver unit 65 receives the data of external data IEXDATA via inverted OR circuit NO3, and provides external data IEXDATA and an inverted data of external data IEXDATA onto bit lines BL and IBL, respectively. The data on bit line pair BL and IBL are written into corresponding bits in page buffer and mask buffer array 51.

Inverter IV3 inverts the level of data on data line IBDAT, and provides it to selector S10.

Selector S10 connects read/write data bus RWDATA to EXNOR unit 61 when a write driver transfer control signal WTR is "0", and connects read/write data bus RWDATA to data line IBDAT when write driver transfer control signal WTR is "1". Write driver transfer control signal WTR becomes "1" during a predetermined period of the mask buffer data transfer.

(Write Sequence)

Figure 12:
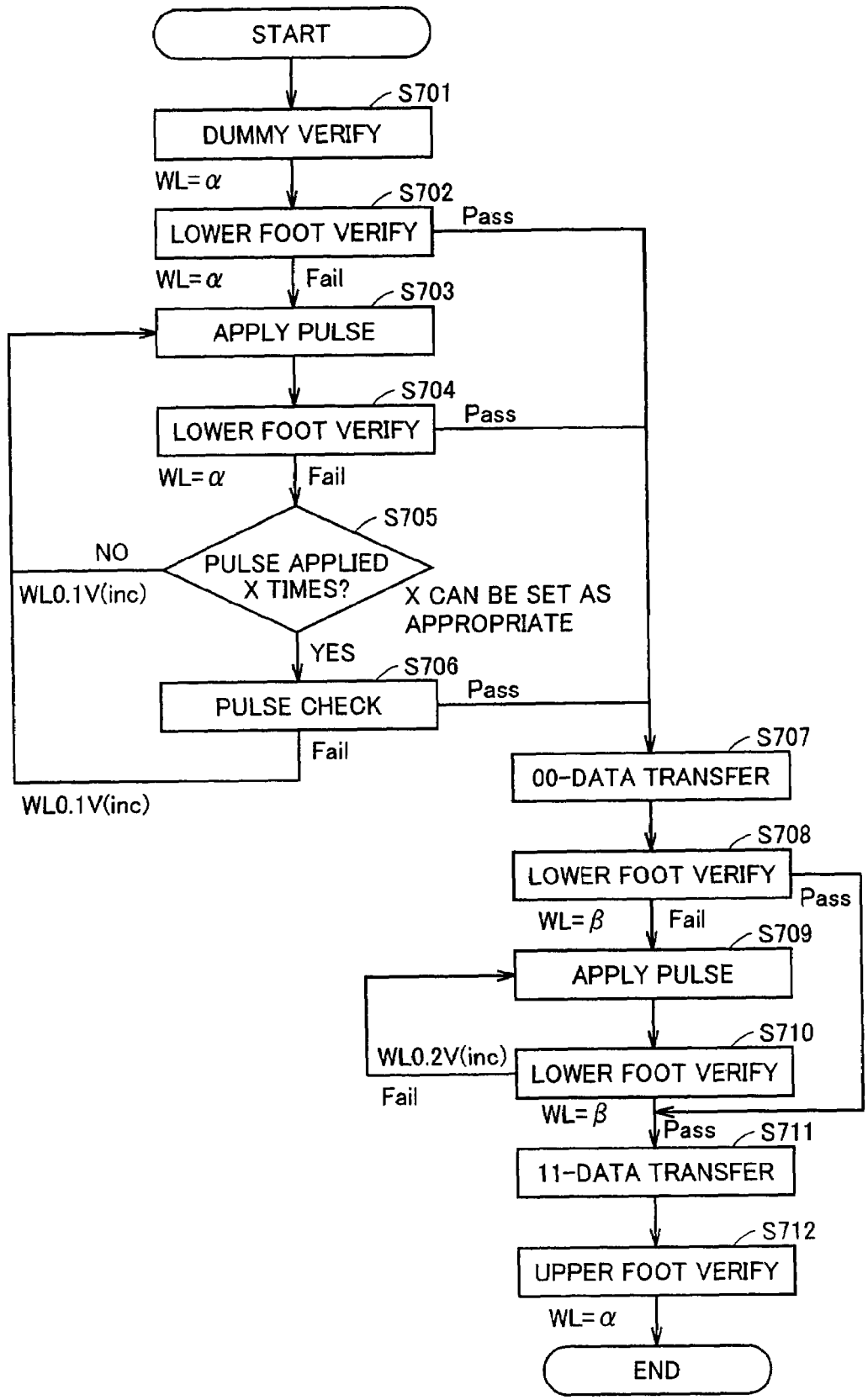
FIG. 12 is a flowchart illustrating a write sequence in the second embodiment of the invention.

Description will now be given on a write sequence of a nonvolatile semiconductor memory device according to the embodiment of the invention. FIG. 12 is a flowchart illustrating a write sequence in a second embodiment.

Referring to FIG. 12, dummy verify is performed as follows in a step S701. Memory array sense amplifier 20 detects current amount Im achieved when the verify voltage ($=\alpha$) is applied to each memory cell. Memory array sense amplifier 20 determines whether detected current amount Im is equal to or smaller than current value. Is ($=I\_01L$), which is achieved when threshold voltage Vth is at the "01" lower foot level ($=V\_01L$), or not. When current amount Im is equal to or smaller than current value Is, memory array sense amplifier 20 provides "0" as a first sense data to verify circuit 54 via read/write data bus RWDATA. When current amount Im is larger than current value Is, memory array sense amplifier 20 provides "1" as the first sense data to verify circuit 54 via read/write data bus RWDATA.

When current amount Im is equal to or smaller than current value Is, it is further determined whether threshold voltage Vth is equal to or higher than the "00" lower foot level (=V__00L) or not. More specifically, memory array sense amplifier 20 detects current amount Im, which is achieved when the verify voltage (=α) is applied to the memory cell. Memory array sense amplifier 20 determines whether detected current amount Im is equal to or smaller than current value Is (=I__00L), which is achieved when threshold voltage Vth is at the "00" lower foot level (=V__00L), or not. When current amount Im is equal to or smaller than current value Is, memory array sense amplifier 20 provides "0" as a second sense data to verify circuit 54 via read/write data bus RWDATA. When current amount Im is larger than current value Is, memory array sense amplifier 20 provides "1" as the second sense data to verify circuit 54 via read/write data bus RWDATA.

When current amount Im exceeds current value Is, it is determined whether threshold voltage Vth is equal to or higher than the "10" lower foot level (=V__10L) or not. More specifically, memory array sense amplifier 20 detects current amount Im, which is achieved when the verify voltage (=α) is applied to the memory cell. Memory array sense amplifier 20 determines whether detected current amount Im is equal to or smaller than current value Is (=I__10L), which is achieved when threshold voltage Vth is at the "10" lower foot level (=V__10L), or not. When current amount Im is equal to or smaller than current value Is, memory array sense amplifier 20 provides "0" as the second sense data to verify circuit 54 via read/write data bus RWDATA. When current amount Im is larger than current value Is, memory array sense amplifier 20 provides "1" as the second sense data to verify circuit 54 via read/write data bus RWDATA.

The write target values of the higher bits of the selected 32 memory cells, which are held in the page buffer unit of page buffer and mask buffer array 51, are provided to verify circuit 54 via Y-gate 52. For each bit, verify circuit 54 calculates an AND value of the first sense data and the write target value of the higher bit.

Verify circuit 54 transfers the AND value of the first sense data and the higher bit to the corresponding bits in the page buffer unit of page buffer and mask buffer array 51.

Then, the write target values of the lower bits of the selected 32 memory cells, which are held in the page buffer unit of page buffer and mask buffer array 51, are provided to verify circuit 54 via Y-gate 52. For each bit, verify circuit 54 calculates an AND value of the second sense data and the write target value of the lower bit.

Verify circuit 54 transfers the AND value of the second sense data and the lower bit to the corresponding bits in the page buffer unit of page buffer and mask buffer array 51.

In a step S702, the lower foot verify of threshold voltages Vth of the selected 32 memory cells is performed as follows.

First, it is determined whether threshold voltage Vth is equal to or lower than the "01" lower foot level (=V__01L) or not. More specifically, memory array sense amplifier 20 detects current amount Im achieved when the verify voltage (=α) is applied to each memory cell. Memory array sense amplifier 20 determines whether detected current amount Im is equal to or smaller than current value Is (=I__01L), which is achieved when threshold voltage Vth is at the "01" lower foot level (=V__01L), or not. When current amount Im is equal to or smaller than current value Is, memory array sense amplifier 20 provides "0" as the first sense data to verify circuit 54 via read/write data bus RWDATA. When current amount Im is larger than current value Is, memory array sense amplifier 20 provides "1" as the first sense data to verify circuit 54 via read/write data bus RWDATA.

When current amount Im is equal to or smaller than current value Is, it is further determined whether threshold voltage Vth is equal to or higher than the "00" lower foot level (=V__00L) or not. More specifically, memory array sense amplifier 20 detects current amount Im, which is achieved when the verify voltage (=α) is applied to the memory cell. Memory array sense amplifier 20 determines whether detected current amount Im is equal to or smaller than current value Is (=I__00L), which is achieved when threshold voltage Vth is at the "00" lower foot level (=V__00L), or not. When current amount Im is equal to or smaller than current value Is, memory array sense amplifier 20 provides "0" as the second sense data to verify circuit 54 via read/write data bus RWDATA. When current amount Im is larger than current value Is, memory array sense amplifier 20 provides "1" as the second sense data to verify circuit 54 via read/write data bus RWDATA.

When current amount Im exceeds current value Is, it is determined whether threshold voltage Vth is equal to or higher than the "10" lower foot level (=V__10L) or not. More specifically, memory array sense amplifier 20 detects current amount Im, which is achieved when the verify voltage (=α) is applied to the memory cell. Memory array sense amplifier 20 determines whether detected current amount Im is equal to or smaller than current value Is (=I__10L), which is achieved when threshold voltage Vth is at the "10" lower foot level (=V__10L), or not. When current amount Im is equal to or smaller than current value Is, memory array sense amplifier 20 provides "0" as the second sense data to verify circuit 54 via read/write data bus RWDATA. When current amount Im is larger than current value Is, memory array sense amplifier 20 provides "1" as the second sense data to verify circuit 54 via read/write data bus RWDATA.

The write target values of the higher bits of the selected 32 memory cells, which are held in the page buffer unit of page buffer and mask buffer array 51, are provided to verify circuit 54 via Y-gate 52. For each bit, verify circuit 54 determines whether the first sense data matches with the write target value of the higher bit or not.

Then, the write target values of the lower bits of the selected 32 memory cells, which are held in the page buffer unit of page buffer and mask buffer array 51, are provided to verify circuit 54 via Y-gate 52. For each bit, verify circuit 54 determines whether the second sense data matches with the write target value of the lower bit or not.

The verify determination values corresponding to the selected 32 memory cells held in the mask buffer unit of page buffer and mask buffer array 51 are provided to verify circuit 54 via Y-gate 52.

Each bit may enter such a state that the first sense data matches with the write target value of the higher bit, and further the second sense data matches with the write target value of the lower bit, or may enter such a state that the verify determination value is "1". For the bit in either of the above state, verify circuit 54 provides the data to the mask buffer unit such that the verify determination value of the corresponding bit in the mask buffer unit of page buffer and mask buffer array 51 may become "1".

Verify circuit 54 provides verify determination signal DIH-VPASS representing "pass" of the lower foot verify to CPU 26 when such a condition is satisfied for all the 32 bits that the first sense data matches with the write target value of the higher bit, and the second sense data matches with the write target value of the lower bit, or that verify determination value is "1". Thereby, CPU 26 moves the processing to a step S707. When mismatching occurs for all the 32 bits, verify circuit 54 provides verify determination signal DIHVPASS representing "fail" of the lower foot verify to CPU 26, and CPU 26 moves the processing to a step S703.

In step S703, the verify determination values of the 32 bits corresponding to the selected 32 memory cells in page buffer and mask buffer array 51 are transmitted to write driver and 32-bit to 64-bit converting circuit 19 via Y-gate 23, verify circuit 54, read/write data bus RWDATA and selector 55. The write driver unit of write driver and 32-bit to 64-bit converting circuit 19 applies a write pulse, which is produced by a voltage control circuit (not shown), to the corresponding memory cell of the bit, of which verify determination value is "0". An initial value of the voltage of this write pulse is 2.0 V.

In a step S704, the lower foot verify is performed similarly to step S702. Verify circuit 54 provides verify determination signal DIHVPASS representing "pass" of the lower foot verify to CPU 26 when such a condition is satisfied for all the 32 bits that the first sense data matches with the write target value of the higher bit, and the second sense data matches with the write target value of the lower bit, or that verify determination value is "1". Thereby, CPU 26 moves the processing to a step S707. When mismatching occurs for all the 32 bits, verify circuit 54 provides verify determination signal DIHVPASS representing "fail" of the lower foot verify, and CPU 26 moves the processing to a step S705.

In step S705, when the times of operation, in which the write pulse is applied to the selected memory cell, (i.e., the times of execution of the loop of steps S703-S705) become equal to or larger than a predetermined number, CPU 26 moves the processing to a step S706. When the times of operation, in which the write pulse is applied to the selected memory cell, is smaller than a predetermined number X CPU 26 instructs the write driver unit in write driver and 32-bit to 64-bit converting circuit 19 to increment the voltage of write pulse by 0.1 V, and repeats the processing in step S703.

In step S706, the pulse check verify is performed as follows. Memory array sense amplifier 20 detects current amount Im achieved when the verify voltage ($=\alpha$) is applied to each memory cell. Memory array sense amplifier 20 determines whether detected current amount Im is equal to or smaller than current value Is ($=I\_01L$), which is achieved when threshold voltage Vth is at the "01" lower foot level ($=V\_01L$), or not. When current amount Im is equal to or smaller than current value Is, memory array sense amplifier 20 provides "0" as the first sense data to verify circuit 54 via read/write data bus RWDATA. When current amount Im is larger than current value Is, memory array sense amplifier 20 provides "1" as the first sense data to verify circuit 54 via read/write data bus RWDATA.

Then, the verify determination values corresponding to the selected 32 memory cells, which are held in the mask buffer unit of page buffer and mask buffer array 51, are provided to verify circuit 54 via Y-gate 52.

For each bit, verify circuit 54 determines whether such a condition is satisfied or not that the first sense data is "0", and verify determination value is "0". When verify circuit 54 determines for all the 32 bits that the first sense data is "0", and verify determination value is "0", it provides verify determination signal DIHVPASS representing "pass" of the pulse check verify to CPU 26, and CPU 26 moves the processing to step S707.

When the condition that the first sense data is "0" and the verify determination value is "0" is not satisfied for all the 32 bits, verify circuit 54 provides the verify determination signal DIHVPASS representing "fail" of the pulse check verify to CPU 26, and CPU 26 instructs the write driver unit in write driver and 32-bit to 64-bit converting circuit 19 to increment the voltage of write pulse by 0.1 V, and repeats the processing in step S703.

In step S707, the 00-data transfer is performed as follows. According to the 00-data transfer, data is transferred to the mask buffer unit such that the verify determination value "0" is stored only in the bits of the mask buffer unit corresponding to the memory cells, of which values stored in the page buffer unit are "00" (i.e., the write target values of higher and lower bits are equal to "0" and "0", respectively).

More specifically, the write target values of the higher bits of the selected 32 memory cells, which are held in the page buffer unit of page buffer and mask buffer array 51, are provided to verify circuit 54 via Y-gate 52.

Then, the write target values of the lower bits for the 32 bits of the selected 32 memory cells, which are held in the page buffer unit of page buffer and mask buffer array 51, are provided to verify circuit 54 via Y-gate 52.

For the bits each satisfying the condition that write target values of the higher and lower bits are "0" and "0", respectively, verify circuit 54 writes "0" into the corresponding bit in the mask buffer unit. For the others bit, verify circuit 54 writes "1" into the corresponding bit in the mask buffer unit.

In a step S708, the lower foot verify is performed similarly to steps S702 and S704. The verify voltage is equal to $\beta$ ($=\alpha+\Delta V$). When the result of the lower foot verify is "pass", CPU 26 moves the processing to a step S711. When the lower foot verify failed, CPU 26 moves the processing to a step S709.

In step S709, the write pulse is applied similarly to the step S703.

In a step S710, the lower foot verify is performed similarly to step S708. When the lower foot verify failed, CPU 26 instructs the voltage control circuit (not shown) to increment the voltage of the write pulse by 0.2 V, and the processing in S709 is repeated. When the result of the lower foot verify is "pass", CPU 26 moves the processing to a step S711.

In step S711, 11-data transfer is performed as follows. According to the 11-data transfer, the data is transferred to the mask buffer unit such that the verify determination value "1" is stored in only the bit of the mask buffer unit corresponding to the memory cell, for which the page buffer unit stored "11" (i.e., the write target values of upper and lower bit are equal to "1" and "1"). Thereby, the result of the upper foot verify of the memory cell, for which the page buffer unit stores "11", automatically becomes "pass".

More specifically, the write target values of the higher bits of the selected 32 memory cells, which are held in the page buffer unit of page buffer and mask buffer array 51, are provided to verify circuit 54 via Y-gate 52.

Then, the write target values of the lower bits of the selected 32 memory cells, which are held in the page buffer unit of page buffer and mask buffer array 51, are provided to verify circuit 54 via Y-gate 52.

If the write target value of the higher and lower bits are "1" and "1" in connection with a certain bit, respectively, verify circuit 54 writes "1" into the corresponding bit in the mask buffer unit. For the bits other than the above, verify circuit 54 writes "0" into the corresponding bits in the mask buffer unit.

In a step S712, the upper foot verify of threshold voltages Vth of the selected 32 memory cells is performed as follows. First, it is determined whether threshold voltage Vth is equal to or lower than "10" upper foot level ($=V\_10H$) or not. More specifically, memory array sense amplifier 20 detects current amount Im achieved when the verify voltage ($=\alpha$) is applied to each memory cell. Memory array sense amplifier 20 determines whether detected current amount Im is equal to or larger than current value Is (=I__10H), which is achieved when threshold voltage Vth is at the "10" upper foot level (=V__10H), or not. When current amount Im is equal to or larger than current value Is, memory array sense amplifier 20 provides "1" as the first sense data to verify circuit 54 via read/write data bus RWDATA. When current amount Im is smaller than current value Is, memory array sense amplifier 20 provides "0" as the first sense data to verify circuit 54 via read/write data bus RWDATA.

When current amount Im is smaller than current value Is, it is further determined whether threshold voltage Vth is equal to or higher than the "01" upper foot level (=V__01H) or not. More specifically, memory array sense amplifier 20 detects current amount Im, which is achieved when the verify voltage (=α) is applied to the memory cell. Memory array sense amplifier 20 determines whether detected current amount Im is equal to or larger than current value Is (=I__01H), which is achieved when threshold voltage Vth is at the "01" upper foot level (=V__01H), or not. When current amount Im is equal to or larger than current value Is, memory array sense amplifier 20 provides "1" as the second sense data to verify circuit 54 via read/write data bus RWDATA. When current amount Im is smaller than current value Is, memory array sense amplifier 20 provides "0" as the second sense data to verify circuit 54 via read/write data bus RWDATA.

When current amount Im is equal to or larger than current value Is, it is further determined whether threshold voltage Vth is equal to or higher than the "11" upper foot level (=V__11H) or not. More specifically, memory array sense amplifier 20 detects current amount Im, which is achieved when the verify voltage (=α) is applied to the memory cell. Memory array sense amplifier 20 determines whether detected current amount Im is equal to or larger than current value Is (−I__11H), which is achieved when threshold voltage Vth is at the "11" upper foot level (=V__11H), or not. When current amount Im is equal to or larger than current value Is, memory array sense amplifier 20 provides "1" as the second sense data to verify circuit 54 via read/write data bus RWDATA. When current amount Im is smaller than current value Is, memory array sense amplifier 20 provides "0" as the second sense data to verify circuit 54 via read/write data bus RWDATA.

The write target values of the higher bits of the selected 32 memory cells, which are held in the page buffer unit of page buffer and mask buffer array 51, are provided to verify circuit 54 via Y-gate 52. For each bit, verify circuit 54 determines whether the first sense data matches with the write target value of the higher bit or not.

Then, the write target values of the lower bits of the selected 32 memory cells, which are held in the page buffer unit of page buffer and mask buffer array 51, are provided to verify circuit 54 via Y-gate 52. For each bit, verify circuit 54 determines whether the second sense data matches with the write target value of the lower bit or not.

The verify determination values corresponding to the selected 32 memory cells held in the mask buffer unit of page buffer and mask buffer array 51 are provided to verify circuit 54 via Y-gate 52.

Each bit may enter such a state that the first sense data matches with the write target value of the higher bit, and further the second sense data matches with the write target value of the lower bit, or may enter such a state that the verify determination value is "1". For the bit in either of the above state, verify circuit 54 provides the data to the mask buffer unit such that the verify determination value of the corresponding bit in the mask buffer unit of page buffer and mask buffer array 51 may become "1".

Verify circuit 54 provides verify determination signal DIHVPASS representing "pass" of the upper foot verify to CPU 26 when such a condition is satisfied for all the 32 bits that the first sense data matches with the write target value of the higher bit, and the second sense data matches with the write target value of the lower bit, or that verify determination value is "1". Thereby, CPU 26 normally ends the write sequence. When mismatching occurs for all the 32 bits, verify circuit 54 provides verify determination signal DIHVPASS representing "fail" of the upper foot verify to CPU 26, and CPU 26 abnormally ends the write sequence.

(Operation of Lower Foot Verify)

A specific operation for the lower foot verify will now be described.

Figure 13:
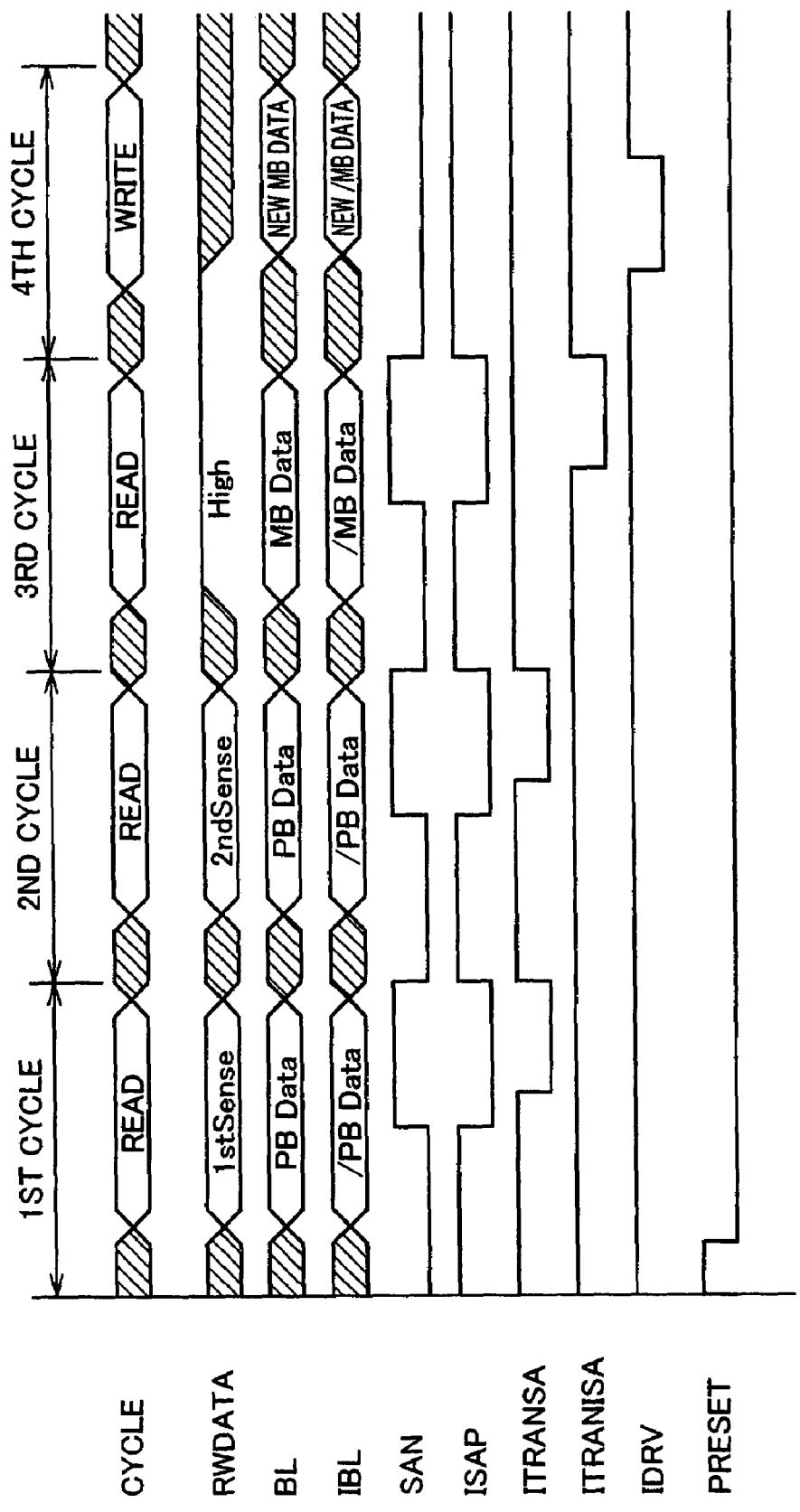
FIG. 13 is a timing chart illustrating lower foot verify.

FIG. 13 is a timing chart illustrating the lower foot verify. First to fourth cycles in FIG. 13 form a verify period. Referring to FIG. 13, page buffer and mask buffer control circuit 53 sets preset signal PRESET to "1". Thereby, the FFREG node in latch unit 63 is preset to "1". Thereafter, page buffer and mask buffer control circuit 53 returns preset signal PRESET to "0".

Memory array sense amplifier 52 provides the first sense data onto read/write data bus RWDATA. The page buffer unit of page buffer and mask buffer array 51 provides the write target value of the higher bit onto bit line BL.

EXNOR unit 61 receives the first sense data from read/write data bus RWDATA, and receives the write target value of the higher bit from the page buffer unit of page buffer and mask buffer array 51 via bit line BL. EXNOR unit 61 provides the data, which corresponds to the matching or mismatching between the first sense data and the write target value of the higher bit, onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the matching, sense amplifier amplified signal SA becomes "1". When EXNOR unit 61 provides the data corresponding to the mismatching, sense amplifier amplified signal SA becomes "0".

Thereafter, page buffer and mask buffer control circuit 53 sets amplified signal take-in signal ITRANSA to "0". Thereby, the FFREG node in latch unit 63 changes according to the level of sense amplifier amplified signal SA. When EXNOR unit 61 provides the data corresponding to the matching (i.e., when sense amplifier amplified signal SA is "1"), the FFREG node attains "1". When EXNOR unit 61 provides the data corresponding to the mismatching (i.e., when sense amplifier amplified signal SA is "0"), the FFREG node attains "0".

In the second cycle, memory array sense amplifier 52 provides the second sense data onto read/write data bus RWDATA. The page buffer unit of page buffer and mask buffer array 51 provides the write target value of the lower bit onto bit line BL.

EXNOR unit 61 receives the second sense data via read/write data bus RWDATA, and receives the write target value of the lower bit from the page buffer unit of page buffer and mask buffer array 51 via bit line BL. EXNOR unit 61 provides the data, which corresponds to matching or mismatching between the second sense data and the write target value of the lower bit, onto bit line pair BL and IBL.

Thereafter, page buffer and mask buffer control circuit 53 sets sense amplifier activating signals SAN and ISAP to "1"

and "0", respectively. Thereby, sense amplifier unit 62 amplifies the data on bit line pair BL and IBL provided from EXNOR unit 61. When EXNOR unit 61 provides the data corresponding to the matching, sense amplifier amplified signal SA becomes "1". When EXNOR unit 61 provides the data corresponding to the mismatching, sense amplifier amplified signal SA becomes "0".

Thereafter, page buffer and mask buffer control circuit 53 sets the amplified signal take-in signal ITRANSA to "0". Thereby, the FFREG node in latch unit 63 changes according to the level of sense amplifier amplified signal SA. If EXNOR unit 61 provides the data corresponding to the matching (i.e., if sense amplifier amplified signal SA is "1"), and the FFREG node was "1" before the change, the FFREG node attains "1". Thus, the FFREG node attains "1" when two bits match with each other. When EXNOR unit 61 provides the data corresponding to the mismatching (i.e., when sense amplifier amplified signal SA is "0"), or if the FFREG node was "0" before the change, the FFREG node attains "0". Thus, the FFREG node attains "0" when mismatching occurs in connection with at least one bit.

In the third cycle, memory array sense amplifier 52 provides a fixed value of "1" onto read/write data bus RWDATA. The mask buffer unit of page buffer and mask buffer array 51 provides the pulse application instruction value onto bit line IBL.

EXNOR unit 61 receives the fixed value of "1" via read/write data bus RWDATA, and receives the pulse application instruction value from the mask buffer unit of page buffer and mask buffer array 51 via bit line IBL. EXNOR unit 61 provides the data, which corresponds to the pulse application instruction value of "1" or "0", onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the determination that the verify determination value is "1" (completion of writing), inverted sense amplifier amplified signal ISA becomes "0". When EXNOR unit 61 provides the data corresponding to the determination that the verify determination value is "0" (incompletion of writing), inverted sense amplifier amplified signal ISA becomes "1".

Thereafter, page buffer and mask buffer control circuit 53 sets inverted amplified signal take-in signal ITRANISA to "0". Thereby, depending on the level of the FFREG node before the change in latch unit 63 as well as the level of inverted sense amplifier amplified signal ISA, the change occurs on the FFIREG node. Only if EXNOR unit 61 determines that the verify determination value is "0" (incompletion of writing) (i.e., inverted sense amplifier amplified signal ISA is "1"), and the FFREG node before the change was "0" (mismatching of at least one bit), the FFIREG node attains "1". If EXNOR unit 61 determines that the verify determination value is "1" (completion of writing) (i.e., inverted sense amplifier amplified signal ISA is "0"), and the FFREG node before the change was "1" (matching of two bits), the FFIREG node attains "0".

In the fourth cycle, page buffer and mask buffer control circuit 53 sets driver control signal IDRV to "0". Thereby, driver unit 65 provides the data on the FFIREG node via bit line pair BL and IBL to the corresponding bit in the mask buffer unit of page buffer and mask buffer array 51. When the FFIREG node carries "1", "0" (incompletion of writing) is written into the mask buffer unit of page buffer and mask buffer array 51. When the FFIREG node carries "0", "1" (completion of writing) is written into the mask buffer unit of page buffer and mask buffer array 51.

Further, page buffer and mask buffer control circuit 53 sets a determination result output control signal CDEN to "1". Thereby, when all the 32 bits on the FFIREG node become "0", a node CDF of verify determining unit 64 attains "1", and verify determination signal DIHVPASS provided from node CDF becomes "1" (i.e., verify determination represents "pass").

When at least one bit among the 32 bits on the FFIREG node carries "1", node CDF of verify determining unit 64 attains "0", and verify determination signal DIHVPASS provided from node CDF attains "0" (verify determination represents "fail").

(Pulse Check Verify)

Figure 14:
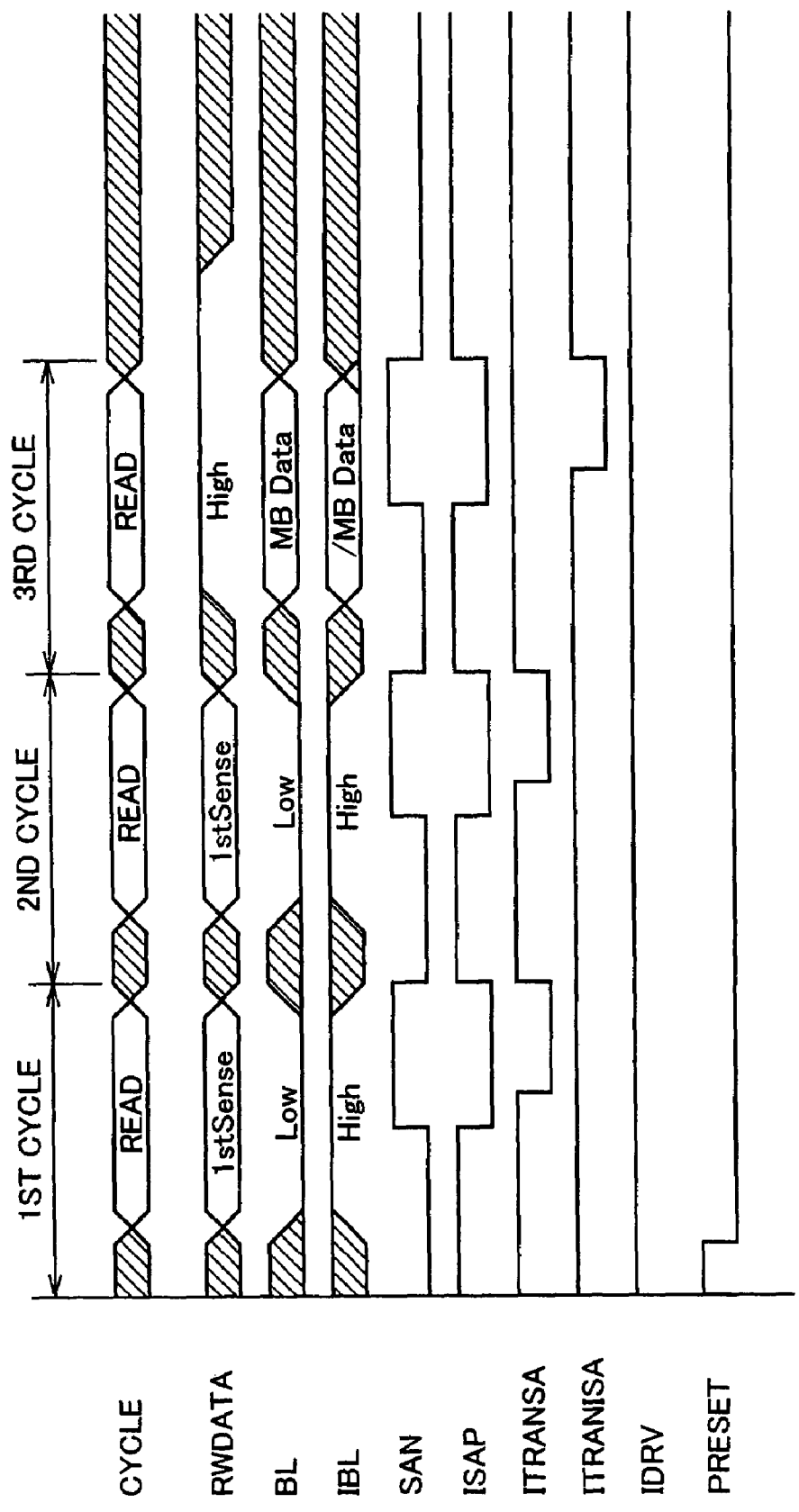
FIG. 14 is a timing chart illustrating pulse check verify.

FIG. 14 is a timing chart illustrating pulse check verify. In FIG. 14, first to third cycles form a verify period. Referring to FIG. 14, page buffer and mask buffer control circuit 53 sets preset signal PRESET to "1" in the first cycle. Thereby, the FFREG node in latch unit 63 is preset to "1". Thereafter, page buffer and mask buffer control circuit 53 returns preset signal PRESET to "0".

Memory array sense amplifier 52 provides the first sense data onto read/write data bus RWDATA. Page buffer and mask buffer control circuit 53 forcedly sets bit line BL to "0" through a control line CTRL.

EXNOR unit 61 receives the first sense data via read/write data bus RWDATA, receives a fixed value of "0" via bit line BL, and provides the data, which corresponds to the first sense data of "1" or "0", onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL, which is provided from EXNOR unit 61. When EXNOR unit 61 provides the data corresponding to the determination that the first sense data is "1", sense amplifier amplified signal SA attains "0", and inverted sense amplifier amplified signal ISA attains "1". When EXNOR unit 61 provides the data corresponding to the determination that the first sense data is "0", sense amplifier amplified signal SA attains "1", and inverted sense amplifier amplified signal ISA attains "0".

Thereafter, page buffer and mask buffer control circuit 53 sets the amplified signal take-in signal ITRANSA to "0". Thereby, the FFREG node in latch unit 63 changes according to the level of sense amplifier amplified signal SA. When EXNOR unit 61 determines that the first sense data is "0" (i.e., when sense amplifier amplified signal SA is "1"), the FFREG node attains "1". When EXNOR unit 61 determines that the first sense data is "1" (i.e., when sense amplifier amplified signal SA is "0"), the FFREG node attains "0".

In the second cycle, the memory array sense amplifier 20 provides the first sense data via read/write data bus RWDATA, and verify circuit 54 and page buffer and mask buffer control circuit 53 perform the processing similarly to the first cycle. This second cycle is employed for achieving such a relationship that the period before output of verify determination signal DIHVPASS for the lower foot verify is equal to that for the upper foot verify, and the second cycle is not essential.

In the third cycle, memory array sense amplifier 52 forcedly sets read/write data bus RWDATA to "1". The mask buffer for the 32 bits in the page buffer and mask buffer array provides the verify determination value onto the bit line BL.

EXNOR unit 61 receives the fixed value of "1" via read/write data bus RWDATA, receives the verify determination value via bit line BL, and provides the data, which corresponds to the verify determination value of "1" or "0", onto bit line pair. BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL, which is provided from EXNOR unit 61. When EXNOR unit 61 provides the data corresponding to the determination that the verify determination value is "1", sense amplifier amplified signal SA attains "1", and inverted sense amplifier amplified signal ISA attains "0". When EXNOR unit 61 provides the data corresponding to the determination that the verify determination value is "0", sense amplifier amplified signal SA attains "0", and inverted sense amplifier amplified signal ISA attains "1".

Thereafter, page buffer and mask buffer control circuit 53 sets inverted amplified signal take-in signal ITRANISA to "0". Thereby, depending on the level of the FFREG node before the change in latch unit 63 as well as the level of inverted sense amplifier amplified signal ISA, the change occurs on the FFIREG node. Only if EXNOR unit 61 determines that the verify determination value is "0" (incompletion of writing) (i.e., inverted sense amplifier amplified signal ISA is "1"), and the FFREG node before the change was "0" (i.e., first sense node was "1"), the FFIREG node attains "1". Only if EXNOR unit 61 determines that the verify determination value is "1" (completion of writing) (i.e., inverted sense amplifier amplified signal ISA is "0"), and the FFREG node before the change was "1" (i.e., first sense node is "0"), the FFIREG node attains "0".

Then, page buffer and mask buffer control circuit 53 sets determination result output control signal CDEN to "1". Thereby, when all the 32 bits on the FFIREG node become "0", node CDF of verify determining unit 64 attains "1", and verify determination signal DIHVPASS provided from node CDF becomes "1" (i.e., verify determination represents "pass").

When at least one bit among the 32 bits on the FFIREG node is "1", node CDF of verify determining unit 64 attains "0", and verify determination signal DIHVPASS provided from node CDF attains "0" (verify determination represents "fail").

(00-Data Transfer)

Figure 15:
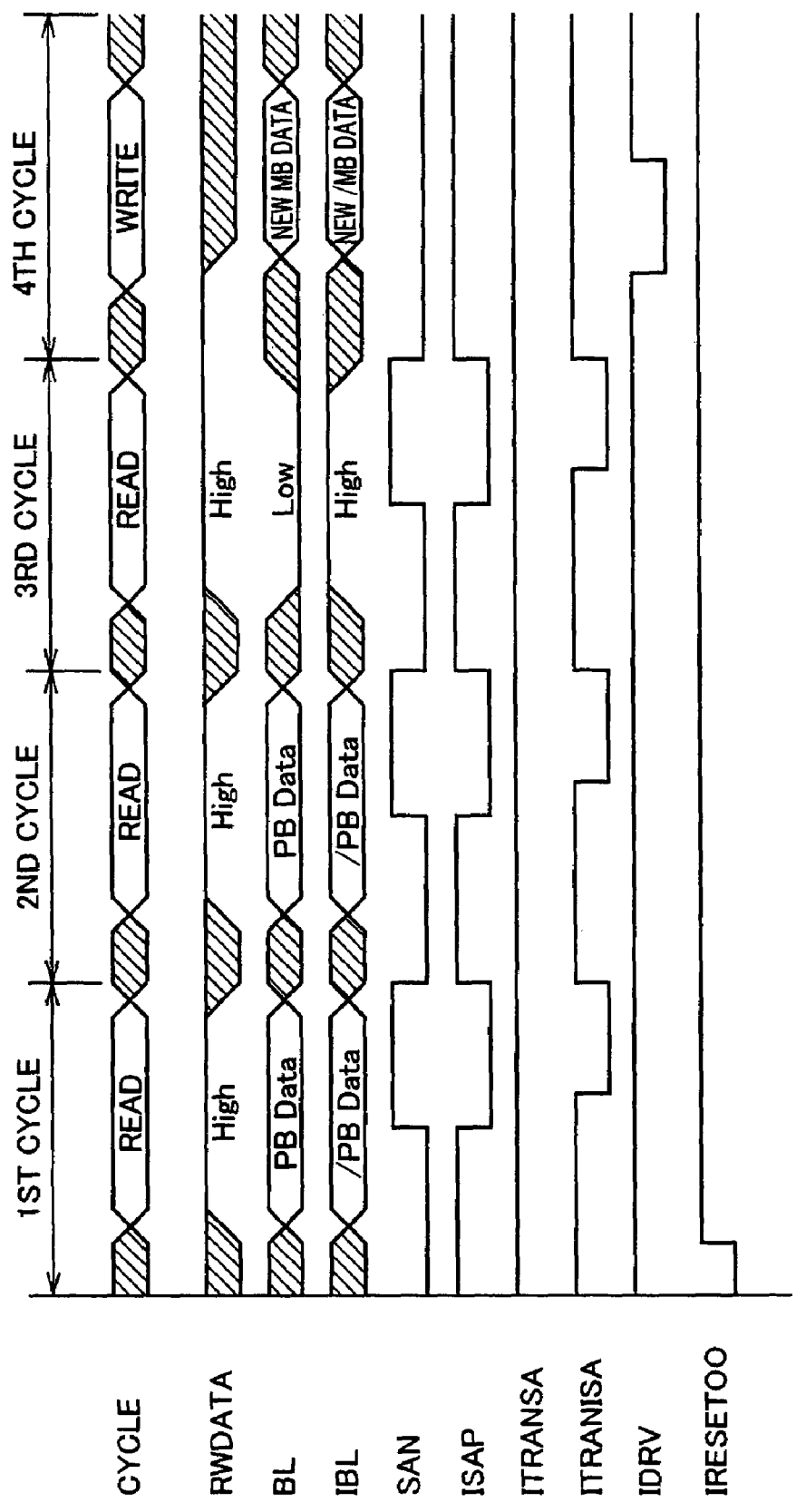
FIG. 15 is a timing chart illustrating 00-data transfer.

FIG. 15 is a timing chart illustrating the 00-data verify. First to fourth cycles in FIG. 15 form a verify period. Referring to FIG. 15, page buffer and mask buffer control circuit 53 sets reset signal IRESET00 to "0" in the first cycle. Thereby, the FFREG node in latch unit 63 is reset to "0". Thereafter, page buffer and mask buffer control circuit 53 returns reset signal IRESET00 to "1".

Memory array sense amplifier 52 provides the fixed value of "1" onto read/write data bus RWDATA. The page buffer unit of page buffer and mask buffer array 51 provides the write target value of the higher bit onto bit line BL.

EXNOR unit 61 receives the fixed value of "1" from read/write data bus RWDATA, and receives the write target value of the higher bit from the page buffer unit of page buffer and mask buffer array 51 via bit line BL. EXNOR unit 61 provides the data, which corresponds to "1" or "0" of the write target value of the higher bit, onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the determination that the write target value of the higher bit is "1", inverted sense amplifier amplified signal ISA becomes "0". When EXNOR unit 61 provides the data corresponding to the determination that the write target value of the higher bit is "0", inverted sense amplifier amplified signal ISA becomes "1".

Thereafter, page buffer and mask buffer control circuit 53 sets inverted amplified signal take-in signal ITRANISA to "0". Thereby, the FFIREG node in latch unit 63 changes according to "0" on the FFREG node thereof and the level of inverted sense amplifier amplified signal ISA. When EXNOR unit 61 determines that the target value of the higher bit is "1" (i.e., when inverted sense amplifier amplified signal ISA is "0"), the FFIREG node attains "0", and the FFREG node attains "1". When EXNOR unit 61 determines that the target value of the higher bit is "0" (i.e., when inverted sense amplifier amplified signal ISA is "1"), the FFIREG node attains "1", and the FFREG node attains "0".

In the second cycle, memory array sense amplifier 52 provides the fixed value of "1" onto read/write data bus RWDATA. The page buffer unit of page buffer and mask buffer array 51 provides the write target value of the lower bit onto bit line BL.

EXNOR unit 61 receives the fixed value of "1" via read/write data bus RWDATA, and receives the write target value of the lower bit from the page buffer unit of page buffer and mask buffer array 51 via bit line BL. EXNOR unit 61 provides the data, which corresponds to "1" or "0" of the write target value of the lower bit, onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the determination that the write target value of the lower bit is "1", inverted sense amplifier amplified signal ISA becomes "0". When EXNOR unit 61 provides the data corresponding to the determination that the write target value of the lower bit is "0", inverted sense amplifier amplified signal ISA becomes "1".

Thereafter, page buffer and mask buffer control circuit 53 sets the inverted amplified signal take-in signal ITRANISA to "0". Thereby, the FFREG node in latch unit 63 changes according to the level of the FFREG node before the change and the level of inverted sense amplifier amplified signal ISA. If EXNOR unit 61 determines that the target value of the higher bit is "0" (i.e., inverted sense amplifier amplified signal ISA is "1"), and the FFREG node was "0" before the change, the FFIREG node attains "1", and the FFREG node attains "0". Thus, when the write target value of page buffer unit of page buffer and mask buffer array 51 is "00", the FFIREG node attains "1", and the FFREG node attains "0". If EXNOR unit 61 determines that the target value of the higher bit is "1" (i.e., inverted sense amplifier amplified signal ISA is "0"), and the FFREG node was "1" before the change, the FFIREG node attains "0", and the FFREG node attains "1". Thus, when the write target value of page buffer unit is "01", "10" or "11", the FFIREG node attains "0", and the FFREG node attains "1".

In the third cycle, memory array sense amplifier 52 provides a fixed value of 1" onto read/write data bus RWDATA. Page buffer and mask buffer control circuit 53 forcedly sets bit line BL to "0" through control line CTRL.

EXNOR unit 61 receives the fixed value of "1" via read/write data bus RWDATA, receives "0" via bit line IBL, and determines that the mismatching occurred between these values.

Thereafter, page buffer and mask buffer control circuit 53 sets sense amplifier activating signals SAN and ISAP to "1"

and "0", respectively. Thereby, sense amplifier unit 62 amplifies the data on bit line pair BL and IBL provided from EXNOR unit 61. Since EXNOR unit 61 determines that the mismatching occurred, inverted sense amplifier amplified signal ISA becomes "1".

Thereafter, page buffer and mask buffer control circuit 53 sets inverted amplified signal take-in signal ITRANISA to "0". Thereby, depending on the level of the FFREG node before the change in latch unit 63 as well as the level of inverted sense amplifier amplified signal ISA, the change occurs on the FFIREG node. If the FFREG node before the change was "0", the FFIREG node attains "1". Thus, when the write target value of page buffer unit of page buffer and mask buffer array 51 is "00", the FFIREG node attains "1". If the FFREG node was "1" before the change, the FFIREG node attains "0". Thus, when the write target value of page buffer unit is "01", "10" or "11", the FFIREG node attains "0".

In the fourth cycle, page buffer and mask buffer control circuit 53 sets driver control signal IDRV to "0". Thereby, driver unit 65 provides the data on the FFIREG node via bit line pair BL and IBL to the corresponding bit in the mask buffer unit of page buffer and mask buffer array 51. When the FFIREG node carries "1", "0" (incompletion of writing) is written into the mask buffer unit of page buffer and mask buffer array 51. When the FFIREG node carries "0", "1" (completion of writing) is written into the mask buffer unit of page buffer and mask buffer array 51.

(11-Data Transfer)

Figure 16:
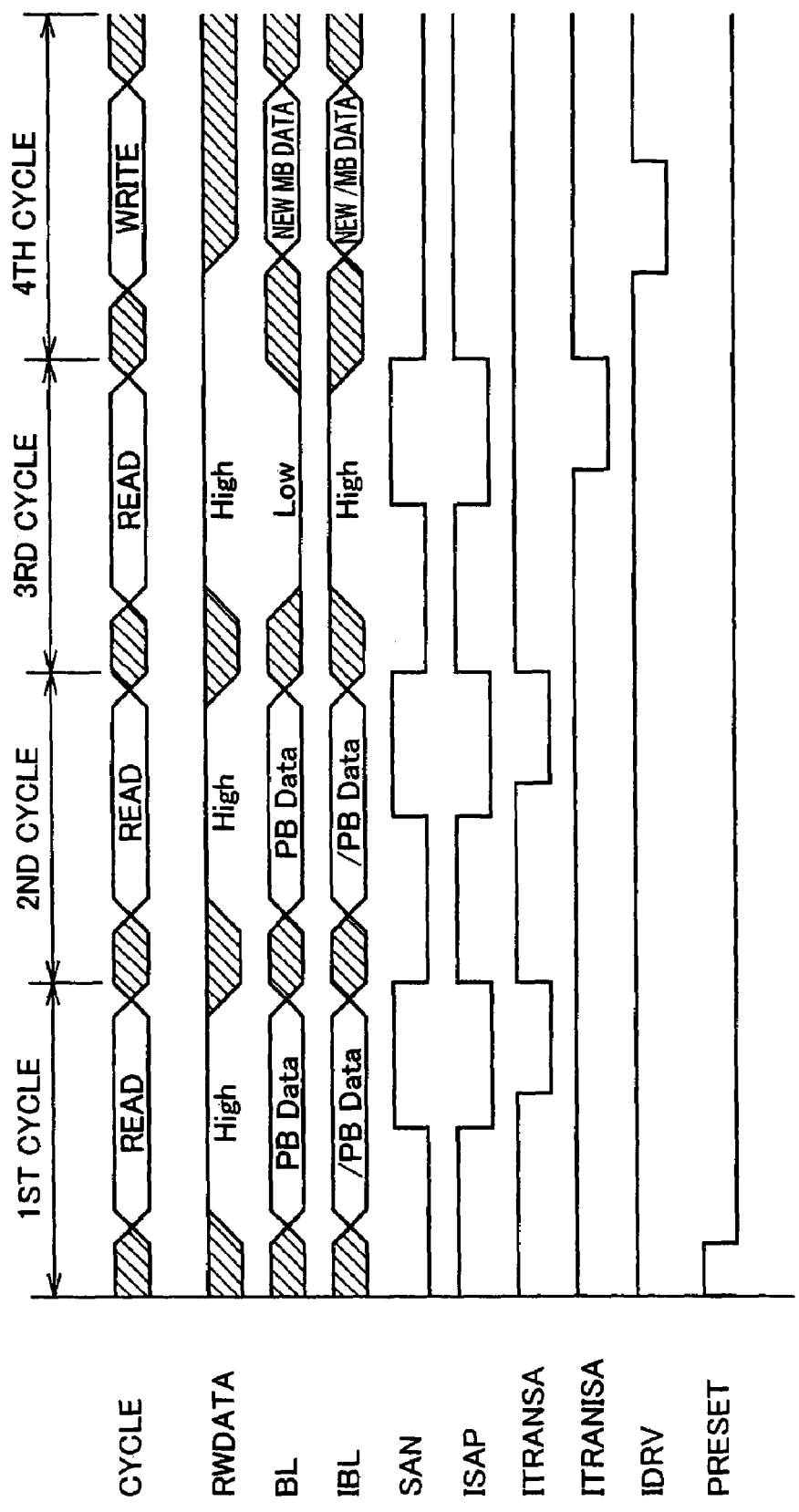
FIG. 16 is a timing chart illustrating 11-data transfer.

FIG. 16 is a timing chart illustrating the 11-data verify. First to fourth cycles in FIG. 16 form a verify period. Referring to FIG. 16, page buffer and mask buffer control circuit 53 sets preset signal PRESET to "1" in the first cycle. Thereby, the FFREG node in latch unit 63 is preset to "1". Thereafter, page buffer and mask buffer control circuit 53 returns preset signal PRESET to "0".

Memory array sense amplifier 52 provides the fixed value of "1" onto read/write data bus RWDATA. The page buffer unit of page buffer and mask buffer array 51 provides the write target value of the higher bit onto bit line BL.

EXNOR unit 61 receives the fixed value of "1" from read/write data bus RWDATA, and receives the write target value of the higher bit from the page buffer unit of page buffer and mask buffer array 51 via bit line BL. EXNOR unit 61 provides the data, which corresponds to "1" or "0" of the write target value of the higher bit, onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the determination that the write target value of the higher bit is "1", sense amplifier amplified signal SA becomes "1". When EXNOR unit 61 provides the data corresponding to the determination that the write target value of the higher bit is "1", sense amplifier amplified signal SA becomes "0".

Thereafter, page buffer and mask buffer control circuit 53 sets amplified signal take-in signal ITRANSA to "0". Thereby, the FFIREG node in latch unit 63 changes according to the level of sense amplifier amplified signal SA. When EXNOR unit 61 determines that the target value of the higher bit is "1" (i.e., when sense amplifier amplified signal SA is "1"), the FFIREG node attains "1". When EXNOR unit 61 determines that the target value of the higher bit is "0" (i.e., when sense amplifier amplified signal SA is "0"), the FFIREG node attains "0".

In the second cycle, memory array sense amplifier 52 provides the fixed value of "1" onto read/write data bus RWDATA. The page buffer unit of page buffer and mask buffer array 51 provides the write target value of the lower bit onto bit line BL.

EXNOR unit 61 receives the fixed value of "1" via read/write data bus RWDATA, and receives the write target value of the lower bit from the page buffer unit of page buffer and mask buffer array 51 via bit line BL. EXNOR unit 61 provides the data, which corresponds to "1" or "0" of the write target value of the lower bit, onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 determines that the write target value of the lower bit is "1", sense amplifier amplified signal SA becomes "1". When EXNOR unit 61 determines that the write target value of the lower bit is "0", sense amplifier amplified signal SA becomes "0".

Thereafter, page buffer and mask buffer control circuit 53 sets the inverted amplified signal take-in signal ITRANSA to "0". Thereby, the FFREG node in latch unit 63 changes according to the level of sense amplifier amplified signal SA. If EXNOR unit 61 determines that the target value of the lower bit is "1" (i.e., sense amplifier amplified signal SA is "1"), and the FFREG node was "1" before the change, the FFREG node attains "1", and the FFIREG node attains "0". Thus, when the write target value of page buffer unit of page buffer and mask buffer array 51 is "11", the FFREG node attains "1", and FFIREG node attains "0". If EXNOR unit 61 determines that the target value of the lower bit is "0" (i.e., sense amplifier amplified signal SA is "0"), and the FFREG node was "0" before the change, the FFREG node attains "0", and the FFIREG node attains "1". Thus, when the write target value of page buffer unit is "00", "01" or "10", the FFREG node attains "0", and the FFIREG node attains "1".

In the third cycle, memory array sense amplifier 52 provides a fixed value of 1" onto read/write data bus RWDATA. Page buffer and mask buffer control circuit 53 forcedly sets bit line BL to "0" through control line CTRL.

EXNOR unit 61 receives the fixed value of "1" via read/write data bus RWDATA, receives "0" via bit line BL, and determines that the mismatching occurred between these values.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. Since EXNOR unit 61 determines that the mismatching occurred, inverted sense amplifier amplified signal ISA becomes "1".

Thereafter, page buffer and mask buffer control circuit 53 sets inverted amplified signal take-in signal ITRANSA to "0". Thereby, depending on the level of the FFREG node before the change in latch unit 63 as well as the level of inverted sense amplifier amplified signal ISA, the change occurs on the FFIREG node. If the FFREG node before the change was "0", the FFIREG node attains "1". Thus, when the write target value of page buffer unit of page buffer and mask buffer array 51 is "00", "01" or "11", the FFIREG node attains "1". If the FFREG node was "1" before the change, the FFIREG node attains "0". Thus, when the write target value of page buffer unit is "11", the FFIREG node attains "0".

In the fourth cycle, page buffer and mask buffer control circuit 53 sets driver control signal IDRV to "0". Thereby, driver unit 65 provides the data on the FFIREG node via bit line pair BL and IBL to the corresponding bit in the mask buffer unit of page buffer and mask buffer array 51. When the FFIREG node carries "1", "0" (incompletion of writing) is written into the mask buffer unit of page buffer and mask buffer array 51. When the FFIREG node carries "0", "1" (completion of writing) is written into the mask buffer unit of page buffer and mask buffer array 51.

(Operation for Upper Foot Verify)

The first and second sense data provided to memory array sense amplifier 20 in the upper foot verify are different from those in the lower foot verify, as already described. However, the operation for the upper foot verify in verify circuit 54 is similar to that for the lower foot verify. Therefore, description of the operation of verify circuit 54 for the upper foot verify is not repeated.

(Dummy Verify)

FIG. 17 is a timing chart illustrating the dummy verify. In FIG. 17, first to fourth cycles form a verify period. Referring to FIG. 14, page buffer and mask buffer control circuit 53 sets preset signal PRESET to "1" in the first cycle. Thereby, the FFREG node in latch unit 63 is preset to "1". Thereafter, page buffer and mask buffer control circuit 53 returns preset signal PRESET to "0".

Memory array sense amplifier 52 provides the first sense data onto read/write data bus RWDATA. Page buffer unit of page buffer and mask buffer array 51 provides the write target value of the higher bit onto bit line BL.

EXNOR unit 61 receives the first sense data via read/write data bus RWDATA, and receives the write target value of the higher bit from the page buffer unit of page buffer and mask buffer array 51 via bit line BL. EXNOR unit 61 provides the data, which corresponds to matching or mismatching between the first sense data and the write target value of the higher bit, onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the determination that the matching occurred, sense amplifier amplified signal SA becomes "1". When EXNOR unit 61 provides the data corresponding to the determination that the mismatching occurred, sense amplifier amplified signal SA becomes "0".

Thereafter, page buffer and mask buffer control circuit 53 sets amplified signal take-in signal ITRANSA to "0". Thereby, the FFREG node in latch unit 63 changes according to the level of sense amplifier amplified signal SA. When EXNOR unit 61 determines that the matching occurred (i.e., when sense amplifier amplified signal SA is "1"), the FFREG node attains "1", and the FFIREG node attains "1". When EXNOR unit 61 determines that the mismatching occurred (i.e., when sense amplifier amplified signal SA is "0"), the FFREG node attains "0", and the FFIREG node attains "1". Consequently, the FFIREG node attains "0" when the first sense data is "1", and the write target value of the higher bit is "1", or when the first sense data is "0", and the write target value of the higher bit is "0". Also, the FFIREG node attains "1" when the first sense data is "1", and the write target value of the higher bit is "0", or when the first sense data is "0", and the write target value of the higher bit is "1".

Page buffer and mask buffer control circuit 53 sets take-in instructing signal IPBWRT to "0". Thereby, latch unit 63 is supplied with the first sense data. The FFREG node in latch unit 63 changes according to the level of the first sense data and the level of the FFIREG node before the change. If the sense data is "1" and the FFIREG node was "0" before the change, the FFIREG node attains "0". If the sense data is "0" and the FFIREG node was "1" before the change, the FFIREG node attains "1".

Consequently, the FFREG node attains "1" when the first sense data is "1" and the write target value of the higher bit is "1". Further, the FFREG node attains "0" when the first sense data is "0" and the write target value of the higher bit is "0". Thus, the FFREG node attains the value of the AND of the first sense data and the write target value of the higher bit. Thereafter, page buffer and mask buffer control circuit 53 returns the take-in instructing signal IPBWRT to "1".

In the second cycle, page buffer and mask buffer control circuit 53 sets driver control signal IDRV to "0". Thereby, driver unit 65 provides the data on the FFIREG node via bit line pair BL and IBL to the corresponding bit in the mask buffer unit of page buffer and mask buffer array 51. When the FFREG node carries "1", "1" is written into the higher bit of the page buffer unit of page buffer and mask buffer array 51. When the FFREG node carries "0", "0" is written into the higher bit of the page buffer unit of page buffer and mask buffer array 51. Consequently, the logical value of the higher bit stored in the page buffer unit of page buffer and mask buffer array 51 is equal to the AND of the first sense data and the write target value of the higher bit.

In the third cycle, the second sense data and the lower bit of the page buffer unit of page buffer and mask buffer array 51 are processed similarly to the processing of the first sense data and the higher bit of the page buffer unit of page buffer and mask buffer array 51 in the first cycle.

In the fourth cycle, the lower bit of the page buffer unit of page buffer and mask buffer array 51 is processed similarly to the processing of the higher bit of the page buffer unit of page buffer and mask buffer array 51 in the third cycle. Consequently, the logical value of the lower bit stored in the page buffer unit of page buffer and mask buffer array 51 is equal to the AND of the second sense data and the write target value of the lower bit.

(Transfer of Mask Buffer Data)

Figure 18:
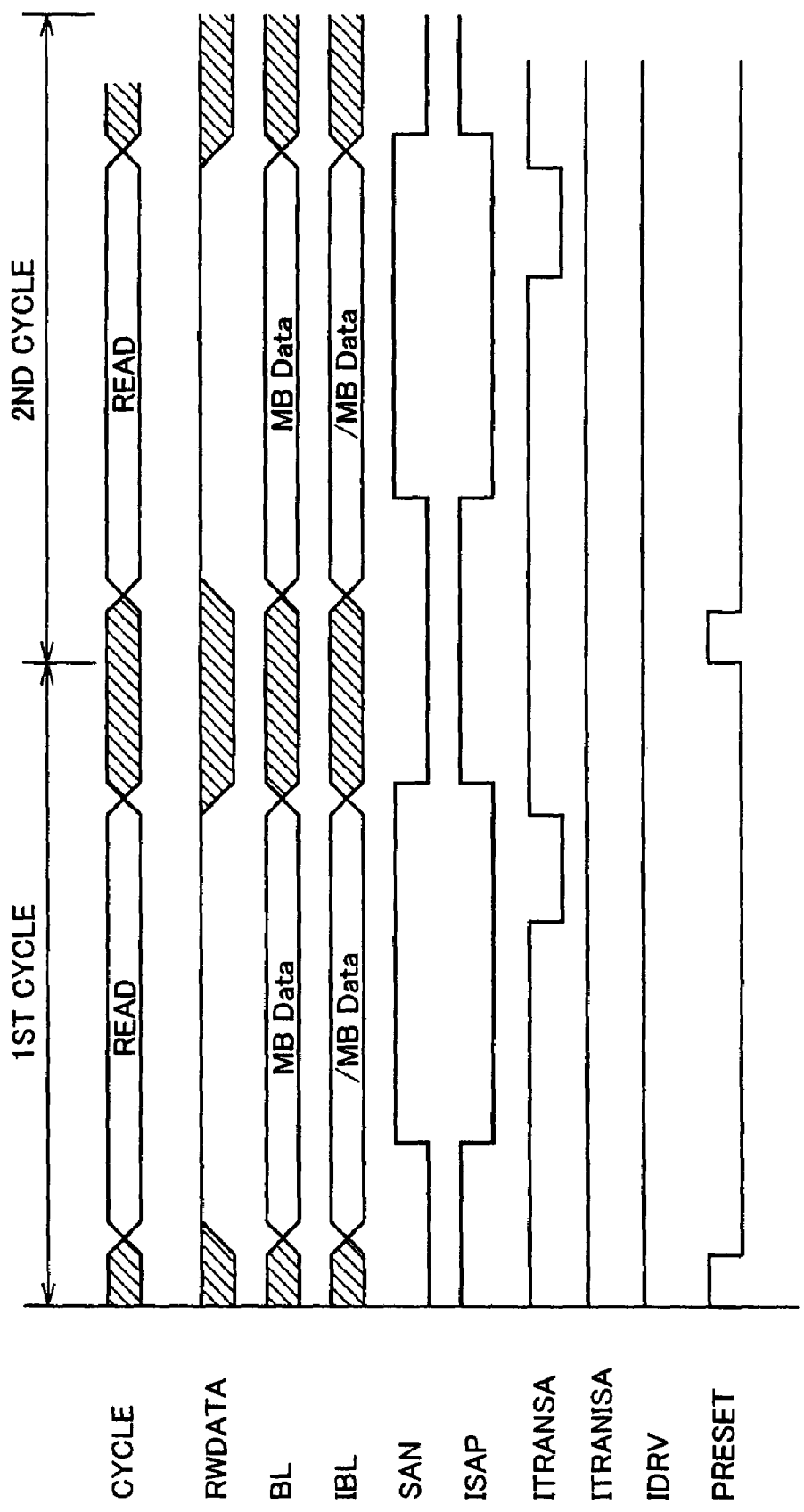
FIG. 18 is a timing chart illustrating mask buffer data transfer.

FIG. 18 is a timing chart illustrating the transfer of the mask buffer data. First and second cycles in FIG. 18 form a verify period. Referring to FIG. 18, page buffer and mask buffer control circuit 53 sets preset signal PRESET to "1" in the first cycle. Thereby, the FFREG node in latch unit 63 is preset to "1". Thereafter, page buffer and mask buffer control circuit 53 returns preset signal PRESET to "0".

Memory array sense amplifier 20 forcedly sets read/write data bus RWDATA to "1". The mask buffer for the 32 bits in the page buffer and mask buffer array provides the verify determination value onto the bit line BL.

EXNOR unit 61 receives the fixed value of "1" via read/write data bus RWDATA, receives the verify determination value via bit line BL, and determines whether the verify determination value is "1" or "0".

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the determination that the verify determination value is "1", sense amplifier amplified signal SA attains "1". When EXNOR unit 61 provides the data corresponding to the determination that the verify determination value is "0", sense amplifier amplified signal SA attains "0"

Thereafter, page buffer and mask buffer control circuit 53 sets amplified signal take-in signal ITRANSA to "0". Thereby, the FFREG node in latch unit 63 changes depending on the level of sense amplifier amplified signal SA. When EXNOR unit 61 determines that the verify determination value is "1" (i.e., sense amplifier amplified signal SA is "1"), the FFREG node attains "1". When EXNOR unit 61 determines that the verify determination value is "0" (i.e., sense amplifier amplified signal SA is "0"), the FFREG node attains "0".

The data on the FFIREG node is provided onto data line IBDAT connected to an inverter IV2 of driver unit 65. When write driver transfer control signal WTR becomes "1", selector S10 connects read/write data bus RWDATA to data line IBDAT. Thereby, the data is transferred via read/write data bus RWDATA to write driver and 32-bit to 64-bit converting circuit 19. Thereby, the data for 32 bits are transferred to write driver and 32-bit to 64-bit converting circuit 19.

In the second cycle, processing similar to that in the first cycle is effected likewise effected on the mask buffer for the other 32 bits in the page buffer and mask buffer array. Thereby, the data for 32 bits is transferred to write driver and 32-bit to 64-bit converting circuit 19.

The 32-bit to 64-bit converting circuit unit in write driver and 32-bit to 64-bit converting circuit 19 produces the data for 32 bits received from read/write data bus RWDATA in the first cycle as well as the data for 32 bits received in the second cycle, and thus produces the data for 64 bits.

When the FFREG node carries "0", i.e., when the verify determination value of the mask buffer unit of page buffer and mask buffer array 51 is "0", the write driver unit in write driver and 32-bit to 64-bit converting circuit 19 applies the write pulse, which is produced by the voltage control circuit (not shown), to the corresponding memory cell. When the FFREG node carries "1", i.e., when the verify determination value of the mask buffer unit of page buffer and mask buffer array 51 is "1", the write driver does not apply the write pulse to the corresponding memory cell.

(Flash to Page Buffer Transfer)

Figure 19:
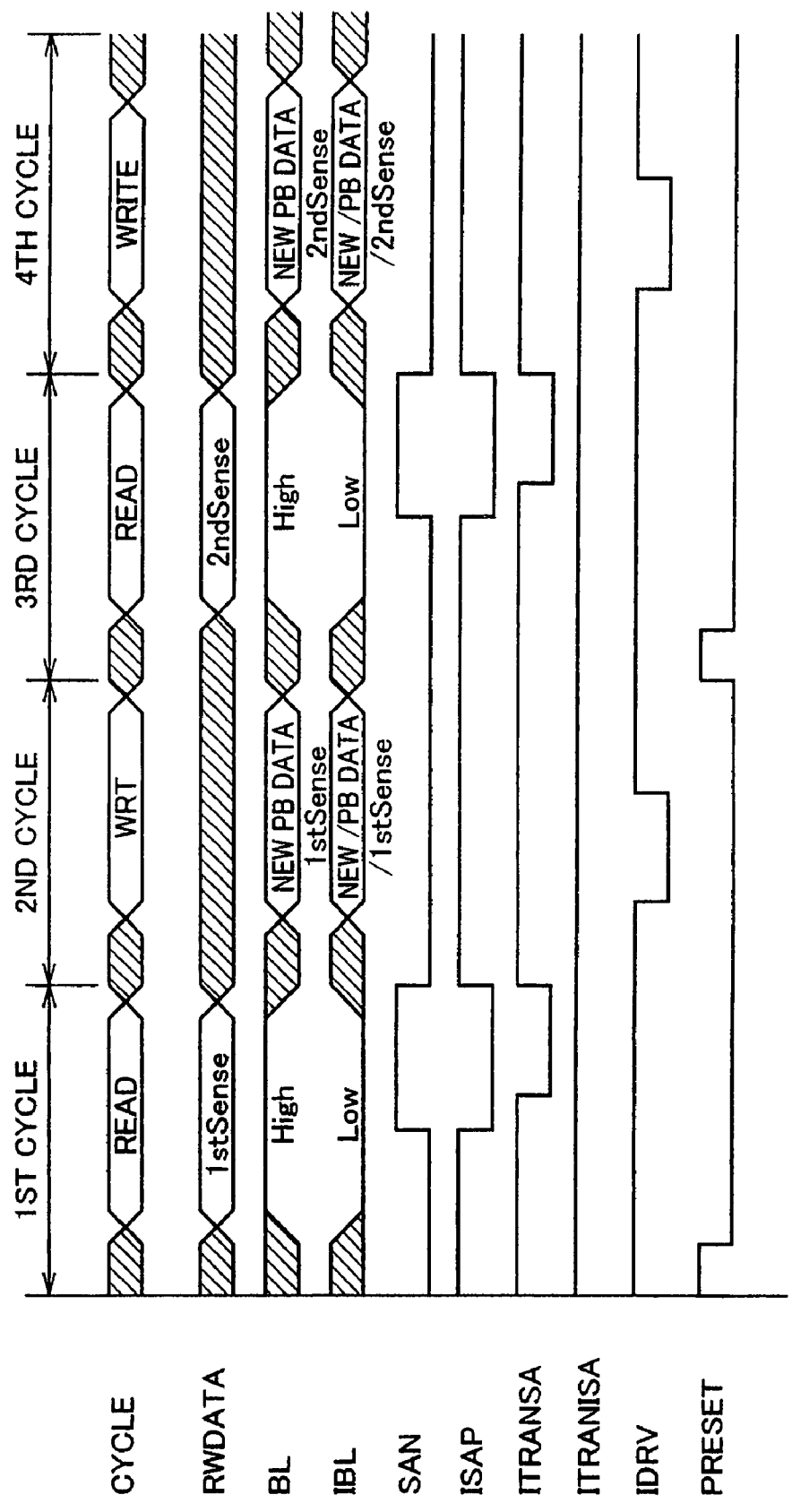
FIG. 19 is a timing chart illustrating flash-to-page buffer transfer.

FIG. 19 is a timing chart illustrating flash to page buffer transfer. In FIG. 19, first to fourth cycles form a verify period. Referring to FIG. 19, page buffer and mask buffer control circuit 53 sets preset signal PRESET to "1" in the first cycle. Thereby, the FFREG node in latch unit 63 is preset to "1". Thereafter, page buffer and mask buffer control circuit 53 returns preset signal PRESET to "0".

Memory array sense amplifier 52 provides the first sense data onto read/write data bus RWDATA. Page buffer and mask buffer control circuit 53 forcedly sets bit line BL to "1" via control line CTRL.

EXNOR unit 61 receives the first sense data via read/write data bus RWDATA, receives the fixed value of "1" via bit line BL, and provides the data, which corresponds the first sense data of "1" or "0", onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the determination that the first sense data is "1", sense amplifier amplified signal SA becomes "1". When EXNOR unit 61 provides the data corresponding to the determination that the first sense data is "0", sense amplifier amplified signal SA becomes "0".

Thereafter, page buffer and mask buffer control circuit 53 sets amplified signal take-in signal ITRANSA to "0". Thereby, the FFREG node in latch unit 63 changes according to the level of sense amplifier amplified signal SA. When EXNOR unit 61 determines that the first sense data is "1" (i.e., when sense amplifier amplified signal SA is "1"), the FFREG node attains "1". When EXNOR unit 61 determines that the first sense data is "0" (i.e., when sense amplifier amplified signal SA is "0"), the FFREG node attains "0".

In the second cycle, page buffer and mask buffer control circuit 53 sets driver control signal IDRV to "0". Thereby, driver unit 65 provides the data on the FFIREG node via bit line pair BL and IBL to the corresponding bit in the page buffer unit of page buffer and mask buffer array 51. When the FFREG node carries "1", "1" is written into the higher bit of the page buffer unit of page buffer and mask buffer array 51. When the FFREG node carries "0", "0" is written into the higher bit of the page buffer unit of page buffer and mask buffer array 51. Consequently, the logical value of the higher bit stored in the page buffer unit of page buffer and mask buffer array 51 is the logical value of the first sense data.

In the third cycle, the second sense data and the lower bit of the page buffer unit of page buffer and mask buffer array 51 are processed similarly to the processing of the first sense data and the higher bit of the page buffer unit of page buffer and mask buffer array 51 in the first cycle.

In the fourth cycle, the lower bit of the page buffer unit of page buffer and mask buffer array 51 is processed similarly to the processing of the higher bit of the page buffer unit of page buffer and mask buffer array 51 in the third cycle. Consequently, the logical value of the lower bit stored in the page buffer unit of page buffer and mask buffer array 51 is equal to the logical value of the second sense data.

(Flash to Page Buffer Inversion Transfer)

Figure 20:
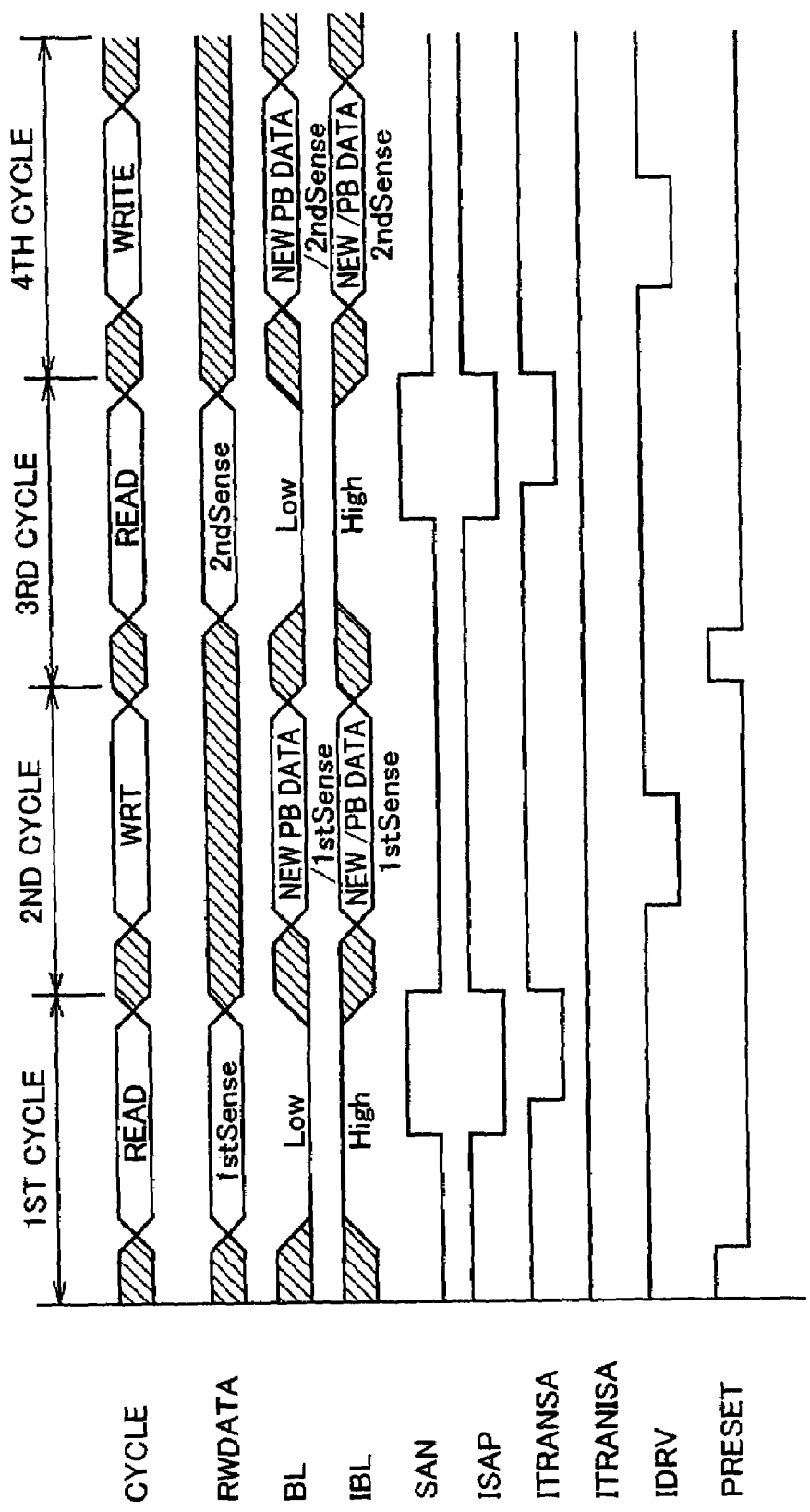
FIG. 20 is a timing chart illustrating flash-to-page buffer inversion transfer.

FIG. 20 is a timing chart illustrating the flash to page buffer inversion transfer. First to fourth cycles in FIG. 20 form a verify period. Referring to FIG. 20, page buffer and mask buffer control circuit 53 sets preset signal PRESET to "1" in the first cycle. Thereby, the FFREG node in latch unit 63 is preset to "1". Thereafter, page buffer and mask buffer control circuit 53 returns preset signal PRESET to "0".

Memory array sense amplifier 52 provides the first sense data onto read/write data bus RWDATA. Page buffer and mask buffer control circuit 53 forcedly sets bit line BL to "0" via control line CTRL.

EXNOR unit 61 receives the first sense node via read/write data bus RWDATA, receives the fixed value of "0" via bit line BL, and provides data, which corresponds to the first sense data of "0" or "1", onto bit line pair BL and IBL.

Thereafter, page buffer and mask buffer control circuit 53 sets sense amplifier activating signals SAN and ISAP to "1" and "0", respectively. Thereby, sense amplifier unit 62 amplifies the data on bit line pair BL and IBL provided from EXNOR unit 61. When EXNOR unit 61 provides the data corresponding to the determination that the first sense data is "0", sense amplifier amplified signal SA attains "1". When EXNOR unit 61 provides the data corresponding to the determination that the first sense data is "1", sense amplifier amplified signal SA attains "0"

Thereafter, page buffer and mask buffer control circuit 53 sets amplified signal take-in signal ITRANSA to "0". Thereby, the FFREG node in latch unit 63 changes depending on the level of sense amplifier amplified signal SA. When EXNOR unit 61 determines that the first sense data is "1" (i.e., sense amplifier amplified signal SA is "1"), the FFREG node attains "1". When EXNOR unit 61 determines that the first sense data is "1" (i.e., sense amplifier amplified signal SA is "0"), the FFREG node attains "0".

In the second cycle, page buffer and mask buffer control circuit 53 sets driver control signal IDRV to "0". Thereby, driver unit 65 provides the data on the FFIREG node via bit line pair BL and IBL to the corresponding bit in the page buffer unit of page buffer and mask buffer array 51. When the FFREG node carries "1", "1" is written into the higher bit of the page buffer unit of page buffer and mask buffer array 51. When the FFREG node carries "0", "0" is written into the higher bit of the page buffer unit of page buffer and mask buffer array 51. Consequently, the logical value of the higher bit stored in the page buffer unit of page buffer and mask buffer array 51 is equal to the inverted value of the logical value of the first sense data.

In the third cycle, the second sense data and the lower bit of the page buffer unit of page buffer and mask buffer array 51 are processed similarly to the processing of the first sense data and the higher bit of the page buffer unit of page buffer and mask buffer array 51 in the first cycle.

In the fourth cycle, the lower bit of the page buffer unit of page buffer and mask buffer array 51 is processed similarly to the processing of the higher bit of the page buffer unit of page buffer and mask buffer array 51 in the third cycle. Consequently, the logical value of the lower bit stored in the page buffer unit of page buffer and mask buffer array 51 is equal to the inverted value of the logical value of the second sense data.

As described above, since the nonvolatile semiconductor memory device of the this embodiment includes the two buffers, i.e., the mask buffer and the page buffer similarly to the first embodiment, the verify can be performed appropriately when writing the multiple values into the nonvolatile memory cell transistors, and further the following can be achieved.

First, by arranging sense amplifier unit 62 within verify circuit 54, the footprint of the nonvolatile semiconductor memory device can be reduced.

The bus can be shared as the bus for the reading, which connects verify circuit 54 to memory array sense amplifier 20, and the bus for writing, which connects verify circuit 54 to write driver and 32-bit to 64-bit converting circuit 19.

Owing to the pulse check verify and the 00-transfer, rapid writing into the memory cells can be achieved by increasing a width or magnitude of increase of the write pulse when writing the logical value of "00".

Owing to the 11-transfer, it is possible to "pass" automatically the upper foot verify of the logical value of "11", which is not a target of writing, in the upper foot verify operation. This prevents such a situation that noises or the like cause variations in level of the "11" upper foot level (=V_11H), and thus causes unnecessary failure in verify.

The dummy verify can correct the write-protected write target value to the write-allowed write target value.

It is possible to perform the transfer of the data from the memory array to the page buffer unit, and to transfer the data from the mask buffer unit via read/write data bus RWDATA.

The signal controlling verify circuit 54 is produced based on internal clock signal ICLK of a period corresponding to a set value in a register, which can be externally set, although not shown. Therefore, a verify period of a desired value can be set, and the operation with low current consumption can be performed by increasing the verify period.

The invention is not restricted to the foregoing embodiment, and includes, e.g., the following modifications.

(1) N-bit Writing

Although the two-bit writing has been described in connection with the embodiments, the invention can be applied to the writing of three or more bits.

(2) Verify Circuit of the First Embodiment

In the first embodiment of the invention, elements and/or control signals may likewise be added to verify circuit 17 to achieve a function of transferring "11" before the upper foot verify, and automatically passing the upper foot verify when the verify determination value in the mask buffer is "1" during the upper foot verify operation.

In the first embodiment of the invention, elements and/or control signals may likewise be added to verify circuit 17 to achieve a function of increasing the magnitude of increase in voltage of the write pulse after the pulse check verify and "00" transfer.

In the first embodiment of the invention, elements and/or control signals may likewise be added to verify circuit 17 to achieve functions of the flash to page buffer transfer, flash to page buffer inversion transfer and mask buffer data transfer.

(3) Clock Corresponding to Set Value in Register

It has been described to provide the signals controlling verify circuit 54 based on internal clock signal ICLK of a period, which corresponds to the set value in the register (not shown) allowing external setting. However, control signals for other circuits related to the verify operation may be produced. For example, the precharge signal, which precharges the bit line connected to memory array sense amplifier 20 and memory cell 21, may be produced based on internal clock signal ICLK of a period corresponding to the set value in the register.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a memory array including a plurality of nonvolatile memory cells arranged in rows and columns, and each storing a logical value of N bits according to a threshold voltage;
   a memory array sense amplifier operating for lower foot verify during a verify operation to provide a logical value of N bits stored in a selected memory cell based on sections of a threshold voltage for the lower foot verify, and operating for upper foot verify during the verify operation to provide a logical value of N bits stored in the selected memory cell based on the sections of a threshold voltage for the upper foot verify;
   a first buffer having N bits each storing a write target value for a corresponding memory cell;
   a second buffer storing a value determining processing to be effected on a corresponding memory cell;
   a write driver selecting application of a write pulse when a value in the second buffer corresponding to said selected memory cell indicates a first value; and
   a verify circuit comparing a logical value of the N bits provided from said memory array sense amplifier with the write target value of the corresponding N bits in said first buffer, providing a signal indicating success of the verify operation when a result of the comparison indicates matching, and providing a signal indicating failure of the verify operation when a result of the comparison indicates mismatching, wherein
   when the result of comparison indicates the matching, and the bit in said second buffer corresponding to said selected memory cell indicates the first value, said verify circuit changes the said bit in said second buffer to indicate a second value;
   wherein said verify circuit transfers said second value to the bit in said second buffer prior to upper foot verify when a corresponding memory cell stores said write target value corresponding to a range of a minimum threshold voltage of the selected memory cell, and wherein said verify circuit provides a signal indicating the verify "pass" during the upper foot verify even when the result of said comparison represents mismatching, if the bit in said second buffer corresponding to the logical value of the N bits to be compared takes the second value.

2. A nonvolatile semiconductor memory device comprising:
- a memory array including a plurality of nonvolatile memory cells arranged in rows and columns, and each storing a logical value of N bits according to a threshold voltage;
- a memory array sense amplifier operating for lower foot verify during a verify operation to provide a logical value of N bits stored in a selected memory cell based on sections of a threshold voltage for the lower foot verify, and operating for upper foot verify during the verify operation to provide a logical value of N bits stored in the selected memory cell based on the sections of a threshold voltage for the upper foot verify;
- a first buffer having N bits each storing a write target value for a corresponding memory cell;
- a second buffer storing a value determining processing to be effected on a corresponding memory cell;
- a write driver selecting application of a write pulse when a value in the second buffer corresponding to said selected memory cell indicates a first value; and
- a verify circuit comparing a logical value of the N bits provided from said memory array sense amplifier with the write target value of the corresponding N bits in said first buffer, providing a signal indicating success of the verify operation when a result of the comparison indicates matching, and providing a signal indicating failure of the verify operation when a result of the comparison indicates mismatching, wherein
- when the result of comparison indicates the matching, and the bit in said second buffer corresponding to said selected memory cell indicates the first value, said verify circuit changes the said bit in said second buffer to indicate a second value;
- a voltage control circuit increasing the write pulse voltage according to the times of repetition of the lower foot verify, wherein
- said verify circuit determines whether a memory cell whose logical value of the N bits, obtained from said memory array sense amplifier, corresponds to a value not exceeding a predetermined threshold voltage and whose corresponding bit in the second buffer takes the first value, is present among a plurality of selected memory cells or not,
- when said memory cell is not present, said verify circuit transfers the first value to corresponding bits in said second buffer for such memory cells among the plurality of selected memory cells that the logical value of N bits in said first buffer corresponds to a range of the maximum threshold, and transfers the second value to the corresponding bits in said second buffer for such memory cells that the logical value of N bits in said first buffer does not correspond to said range of the maximum threshold, and
- said voltage control circuit controls a magnitude of the write pulse voltage after transfer of the first or second value to said second buffer to be greater than that before the transfer of the first or second value to said second buffer.

3. A nonvolatile semiconductor memory device comprising:
- a memory array including a plurality of nonvolatile memory cells arranged in rows and columns, and each storing a logical value of N bits according to a threshold voltage;
- a memory array sense amplifier operating for lower foot verify during a verify operation to provide a logical value of N bits stored in a selected memory cell based on sections of a threshold voltage for the lower foot verify, and operating for upper foot verify during the verify operation to provide a logical value of N bits stored in the selected memory cell based on the sections of a threshold voltage for the upper foot verify;
- a first buffer having N bits each storing a write target value for a corresponding memory cell;
- a second buffer storing a value determining processing to be effected on a corresponding memory cell;
- a write driver selecting application of a write pulse when a value in the second buffer corresponding to said selected memory cell indicates a first value; and
- a verify circuit comparing a logical value of the N bits provided from said memory array sense amplifier with the write target value of the corresponding N bits in said first buffer, providing a signal indicating success of the verify operation when a result of the comparison indicates matching, and providing a signal indicating failure of the verify operation when a result of the comparison indicates mismatching, wherein
- when the result of comparison indicates the matching, and the bit in said second buffer corresponding to said selected memory cell indicates the first value, said verify circuit changes the said bit in said second buffer to indicate a second value;
- wherein said first and second buffers form a buffer array,
- wherein said write target value and a value defining said processing are transferred between said buffer array and said verify circuit,
- wherein said memory array sense amplifier transfers each of bits of the logical value of the N bits stored in said memory cells in serial to said verify circuit via a dual-purpose read and write bus, and
- wherein said verify circuit transfers said value defining the processing to said write driver via said dual-purpose read and write bus.

* * * * *